US011901171B2

(12) United States Patent
Wu et al.

(10) Patent No.: US 11,901,171 B2
(45) Date of Patent: Feb. 13, 2024

(54) INTEGRATED ALIGNED STEALTH LASER WITH BLADE AND GRINDING APPARATUS FOR WAFER EDGE TRIMMING PROCESS

(71) Applicant: Taiwan Semiconductor Manufacturing Co., Ltd., Hsin-Chu (TW)

(72) Inventors: Ming-Tung Wu, Hsinchu (TW); Hsun-Chung Kuang, Hsinchu (TW); Tung-He Chou, Hsinchu (TW)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 579 days.

(21) Appl. No.: 17/088,805

(22) Filed: Nov. 4, 2020

(65) Prior Publication Data
US 2021/0193453 A1    Jun. 24, 2021

Related U.S. Application Data

(60) Provisional application No. 62/951,287, filed on Dec. 20, 2019.

(51) Int. Cl.
*H01L 21/02* (2006.01)
*B23K 26/53* (2014.01)
(Continued)

(52) U.S. Cl.
CPC ...... *H01L 21/02021* (2013.01); *B23K 26/032* (2013.01); *B23K 26/53* (2015.10);
(Continued)

(58) Field of Classification Search
CPC .. B23K 26/53; B23K 26/032; B23K 2103/56; B23K 26/0006; B23K 26/0622;
(Continued)

(56) References Cited

U.S. PATENT DOCUMENTS

| 2004/0207097 A1* | 10/2004 | Carpi | H01L 23/544 |
| | | | 257/E23.179 |
| 2006/0141744 A1* | 6/2006 | Best | H01L 25/50 |
| | | | 257/E21.705 |

(Continued)

OTHER PUBLICATIONS

DISCO Technology. "Dicing by Laser (Laser Dicing)." The date of publication is unknown. Retrieved on Jul. 20, 2020 from https://technology.discousa.com/method/laser/.

(Continued)

*Primary Examiner* — John P. Dulka
(74) *Attorney, Agent, or Firm* — Eschweiler & Potashnik, LLC

(57) ABSTRACT

In some embodiments, the present disclosure relates to a method that includes aligning a stealth laser apparatus over a wafer using an infrared camera coupled to the stealth laser apparatus. The stealth laser apparatus is used to form a stealth damage region within the wafer that is continuously connected around the wafer and separates an inner region from an outer region of the wafer. The stealth damage region is also arranged at a first distance from an edge of the wafer and extends from a first depth to a second depth beneath a top surface of the wafer. Further, the method includes forming a groove in the wafer to separate the outer region from the inner region of the wafer. The outer region of the wafer is removed using a blade, and a top portion of the inner region of the wafer is removed using a grinding apparatus.

20 Claims, 18 Drawing Sheets

(51) Int. Cl.
  B23K 26/03    (2006.01)
  H01L 21/268   (2006.01)
  H01L 23/544   (2006.01)
  H01L 21/66    (2006.01)
  H01L 21/304   (2006.01)
  B23K 103/00   (2006.01)

(52) U.S. Cl.
  CPC ........ *H01L 21/268* (2013.01); *H01L 21/3043* (2013.01); *H01L 22/20* (2013.01); *H01L 23/544* (2013.01); *B23K 2103/56* (2018.08); *H01L 2223/54426* (2013.01); *H01L 2223/54493* (2013.01)

(58) Field of Classification Search
  CPC ............. H01L 21/02021; H01L 21/268; H01L 21/3043; H01L 22/20; H01L 23/544; H01L 2223/54426; H01L 2223/54493
  See application file for complete search history.

(56) References Cited

U.S. PATENT DOCUMENTS

| | | | | |
|---|---|---|---|---|
| 2013/0306993 | A1* | 11/2013 | Ho | H01L 33/0095 438/22 |
| 2019/0355698 | A1* | 11/2019 | Guo | H01L 23/544 |
| 2020/0105715 | A1* | 4/2020 | Jang | H01L 23/552 |
| 2020/0111658 | A1* | 4/2020 | Sugiya | H01L 21/67092 |
| 2021/0242010 | A1* | 8/2021 | Tanoue | B23K 26/0884 |

OTHER PUBLICATIONS

DISCO Corporation. "Backside Chipping, Part 3: Workpiece-Related Factors." Published in 2003.
DISCO Corporation. "Cutting Using a WaterJet Saw." The date of publication is unknown. Retrieved on Jul. 20, 2020 from https://www.discousa.com/eg/solution/library/water.html.
DISCO Corporation. "Dicing Application With Ultrasonic Technology." The date of publication is unknown. Retrieved online on Jul. 20, 2020 from https://www.discousa.com/eg/solution/library/usw.html.
DISCO Corporation. "Processing Sapphires With Lasers." The date of publication is unknown. Retrieved online on Jul. 20, 2020 from https://www.discousa.com/eg/solution/library/sapphire.html.
DISCO Corporation. "SDBG (Stealth Dicing Before Grinding) Process." The date of publication is unknown. Retrieved online on Jul. 20, 2020 from https://www.disco.co.jp/eg/index.html.
DISCO Corporation. "Stealth Dicing Treatment Application." The date of publication is unknown. Retrieved online on Jul. 20, 2020 from http://www.discousa.com/eg/solution/library/stealth.html.
DISCO Corporation. "Ultra-Thin Grinding." The date of publication is unknown. Retrieved online on Jul. 20, 2020 from http://www.discousa.com/eg/solution/library/thin.html.
DISCO Corporation. "Laser Dicing Solutions." The date of publication is unknown. Retrieved online on Dec. 20, 2019 from http://www.discousa.com/eg/laser/method.html.
ScanAndMake. "Laser Cut Technologies." The date of publication is unknown. Retrieved online on Jluy 20, 2020 from https://scanandmake.com/lasertech.
Ohmura, Etsuji. "Temperature Rise of Silicon Due to Absorption of Permeable Pulse Laser." Heat Transfer—Engineering Applications, published Dec. 2011.
Gaudiuso et al. "One-Step Femtosecond Laser Stealth Dicing of Quartz." Micromachines 2020, 11, 327, published on Mar. 22, 2020.
Yadav et al. "Stealth Dicing of Sapphire Wafers With Near Infra-Red Femtosecond Pulses." Appl. Phys. A (2017) 123:369, published on Apr. 25, 2017.
PTIM Wafer Services. "Wafer Edge Trimming." The date of publication is unknown. Retrieved online on Jul. 31, 2020 from https://www.optimwaferservices.com/wafer-processing/wafer-edge-trimming/.
Hamamatsu Photonics. "What Exactly is Stealth Dicing Process?" The date of publication is unknown. Retrieved online on Jul. 20, 2020 from https://sd.hamamatsu.com/jp/en/SD_outline/index.html.

* cited by examiner

INTEGRATED ALIGNED STEALTH LASER WITH BLADE AND GRINDING APPARATUS FOR WAFER EDGE TRIMMING PROCESS

REFERENCE TO RELATED APPLICATION

This application claims the benefit of U.S. Provisional Application No. 62/951,287, filed on Dec. 20, 2019, the contents of which are hereby incorporated by reference in their entirety.

BACKGROUND

Semiconductor device fabrication is a process used to create integrated circuits that are present in everyday electronic devices. The fabrication process is a multiple-step sequence of photolithographic and chemical processing steps during which electronic circuits are gradually created on a wafer composed of a semiconductor material. After fabricating integrated circuits on a first wafer, the first wafer may be bonded to a second wafer. Wafer edge trimming may be used to remove and/or prevent damage to the first and second wafers after bonding.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1A:
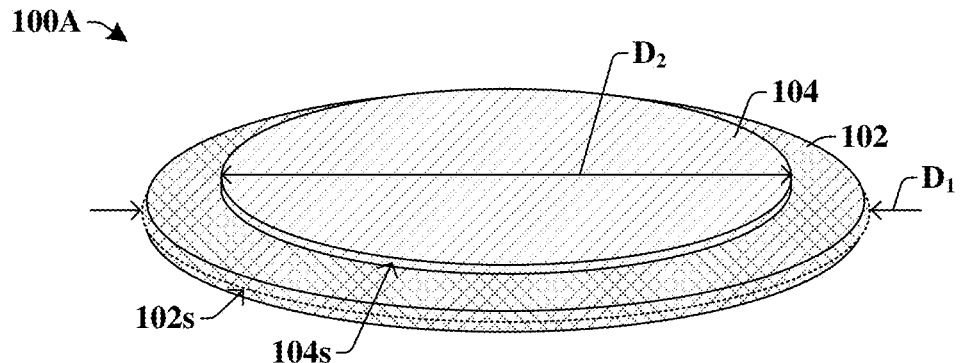
FIGS. 1A-1C illustrate various views of some embodiments of a second wafer arranged over and bonded to a first wafer, wherein the second wafer has a smaller diameter and thickness than the first wafer.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

After a second wafer is bonded to and arranged over a first wafer, portions of the second wafer may be removed by a wafer edge trimming process to mitigate or prevent peeling at the edges of the first and second wafers. Without the wafer edge trimming process, peeling of the second wafer away from the first wafer may occur during further processing steps such as, for example, packaging and dicing of the first and second wafers. To perform the wafer edge trimming process, upper portions of the second wafer may be removed by a thinning or planarization process. Then, a camera scans the second wafer to locate a center of the second wafer to align a blade on an edge of the second wafer. Lastly, the blade having an abrasive surface is utilized to remove outer portions of the second wafer. However, the abrasive surface of the blade may damage new surfaces of the first and/or second wafers defined by the blade. Further, the precision and accuracy of the alignment of the blade on the edge of the second wafer by way of the camera scanning on the second wafer may be poor, and thus, more or less portions of the second wafer may be removed than desired.

Various embodiments of the present disclosure relate to a wafer edge trimming process comprising infrared (IR) alignment, a stealth laser apparatus, blade trimming, and grinding. First, after the second wafer is bonded to the first wafer, an IR alignment process may be conducted using alignment marks on the first wafer that were previously used for patterning processes. Thus, new markings for the IR alignment process on the first or second wafer are not needed. An IR camera may be used in the IR alignment process that is integrated in a stealth laser apparatus and/or a blade. In some embodiments, by using IR alignment instead of a scanning camera, for example, accuracy of aligning the blade and the stealth laser apparatus on the second wafer improves from about 500 micrometers to about 3 micrometers, for example.

After the IR alignment, the stealth laser apparatus may be used to form a stealth damage (SD) region within the second wafer. In some embodiments, the SD region is a continuously connected region at a certain distance away from the perimeter or edge of the second wafer. The SD region advantageously has a small kerf width and can be controlled such that the SD region is arranged at a depth between a topmost surface and a lowermost surface of the second wafer.

Further, after the formation of the SD region, in some embodiments, a blade trimming process is conducted using the blade. In some embodiments, forces from the blade on the SD region may cause a groove to form in the second wafer along the SD region, wherein the groove extends from the top surface to the bottom surface of the second wafer. The blade also removes outer edges of the second wafer defined by the groove extending through the second wafer. In some embodiments, a grinding process using a grinding apparatus is then performed to reduce the thickness of the second wafer.

By using IR alignment, the stealth laser apparatus and/or the blade may be better aligned on the second wafer and thus, be more reliable in performing the wafer edge trimming process at a desired location on the second wafer. Further, by using a stealth laser over other laser techniques (e.g., ablation laser), outer edges of the second wafer after the wafer edge trimming process will be substantially smooth and defect-free, and peeling between the first and second wafers is mitigated.

FIG. 1A illustrates a perspective view 100A of some embodiments of a stack of wafers bonded to one another.

The perspective view 100A of FIG. 1A includes a second wafer 104 arranged over and bonded to a first wafer 102. In some embodiments, a center of the second wafer 104 may directly overlie a center of the first wafer 102, such that the first and second wafers 102, 104 are aligned with one another. In some embodiments, the first and second wafers 102, 104 may each comprise a semiconductor material such as, for example, silicon, germanium, or the like. In some embodiments, the first wafer 102 and the second wafer 104 have overall circular shapes. The first wafer 102 has a first diameter $D_1$, and the second wafer 104 has a second diameter $D_2$. The second diameter $D_2$ of the second wafer 104 is less than the first diameter $D_1$ of the first wafer 102. In some embodiments, a difference between the first diameter $D_1$ and the second diameter $D_2$ may be in a range of between, for example, approximately 0.2 millimeters and approximately 2 millimeters.

In some embodiments, the first wafer 102 has outer sidewalls 102s that are substantially curved, whereas the second wafer 104 has outer sidewalls 104s that are substantially vertical or straight. In such embodiments, the second wafer 104 may have substantially vertical or straight outer sidewalls 104s because the second wafer 104 was trimmed after being bonded to the first wafer 102. Further, in some embodiments, the outer sidewalls 104s of the second wafer 104 are substantially smooth with minimal defects due to a wafer edge trimming process. In other words, an average surface roughness of the outer sidewalls 104s of the second wafer 104 may be about equal to an average surface roughness of a topmost surface of the second wafer 104, in some embodiments. In some embodiments, to measure average surface roughness, a roughness measurement tool (e.g., a profilometer, AFM) calculates a mean line along a surface and measures the deviation between the height of a peak or valley on the surface from the mean line. After measuring many deviations at many peaks and valleys throughout the surface, the average surface roughness is calculated by taking the mean of the many deviations, where the deviations are absolute values. In other embodiments, the average surface roughness is quantified by measuring a total thickness variation (TTV). The TTV of a layer is the difference between the smallest thickness and the largest thickness of the layer. The TTV is measured throughout the length of a layer.

During the wafer edge trimming process that defines the outer sidewalls 104s of the second wafer 104 of FIG. 1A, a stealth laser apparatus is used to form a stealth damage region within the second wafer 104 and between an outer region and an inner region of the second wafer 104. Then, in some embodiments, a blade may be used to remove the outer region of the second wafer 104. Forces from the blade cause a groove to form from the stealth damage region such that the inner region is completely separated from the outer region of the second wafer 104. Because of the groove, the blade does not need to actually contact the inner region of the second wafer 104. After the outer region is removed from the inner region of the second wafer 104, the stealth damage region is removed by a grinding process, such that the outer sidewalls 104s of the second wafer 104 are substantially smooth with minimal defects after the wafer edge trimming process.

Figure 1B:
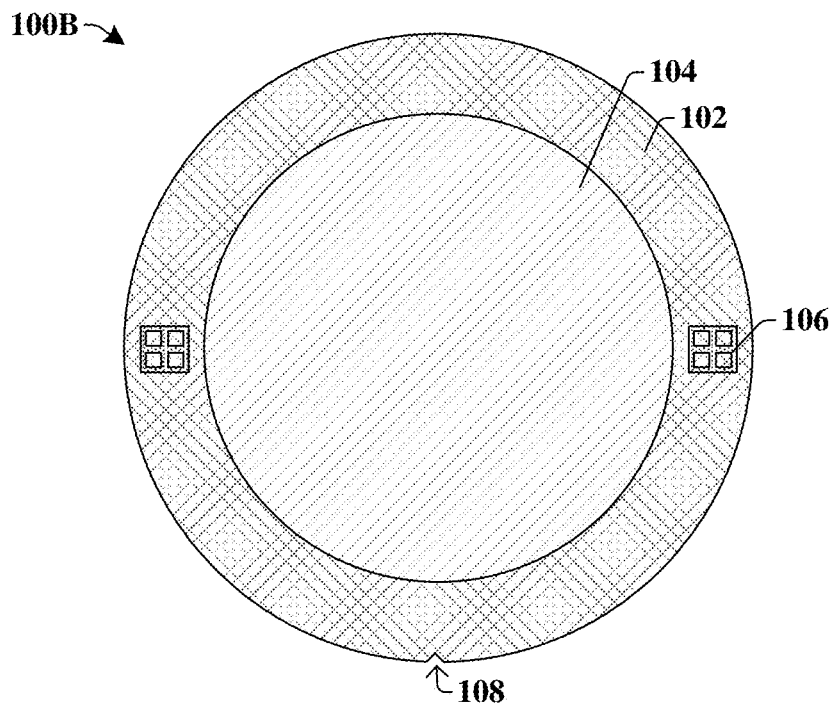

FIG. 1B illustrates a top-view 100B of some embodiments of the second wafer 104 bonded over the first wafer 102.

In some embodiments, first alignment marks 106 are arranged on the first wafer 102. The first alignment marks 106 may have been used for alignment of patterning equipment over the first wafer 102 during manufacturing. In some embodiments, the second wafer 104 does not directly overlie the first alignment marks 106, whereas in some other embodiments, the second wafer 104 may partially or completely overlie the first alignment marks 106 on the first wafer 102. In yet other embodiments, the first alignment marks 106 may be arranged within or on a backside of the first wafer 102, and thus, not visible from the top-view 100B of FIG. 1B. In some embodiments, the first alignment marks 106 may be or comprise a different material than the first wafer 102. In some other embodiments, the first alignment marks 106 may be portions of the first wafer 102 that have been removed, such that the first alignment marks 106 have upper surfaces arranged below a topmost surface of the first wafer 102, for example. Further, in some embodiments, the first alignment marks 106 have a different shape from the top-view 100B than what is illustrated in FIG. 1B such as, for example, a cross, a circle, a square, a star, or the like.

In some embodiments, the first wafer 102 also comprises a first notch 108. The first notch 108 may be an indentation in an edge of the first wafer 102. In some embodiments, the first notch 108 also is used for alignment of patterning equipment and/or alignment of the first wafer 102 over a wafer chuck during manufacturing. In some embodiments, the first notch 108 has an overall triangular-shape, a rounded-shape, or the like.

In some embodiments, the second wafer 104 may have originally comprised second alignment marks and/or a second notch. However, during the wafer edge trimming process, the second alignment marks and/or the second notch may be removed. In some other embodiments, none or only part of the second alignment marks of the second wafer 104 are removed during the wafer edge trimming process. In such other embodiments, second alignment marks (not shown) may be visible on the second wafer 104 from the top-view 100B of FIG. 1B.

Figure 1C:
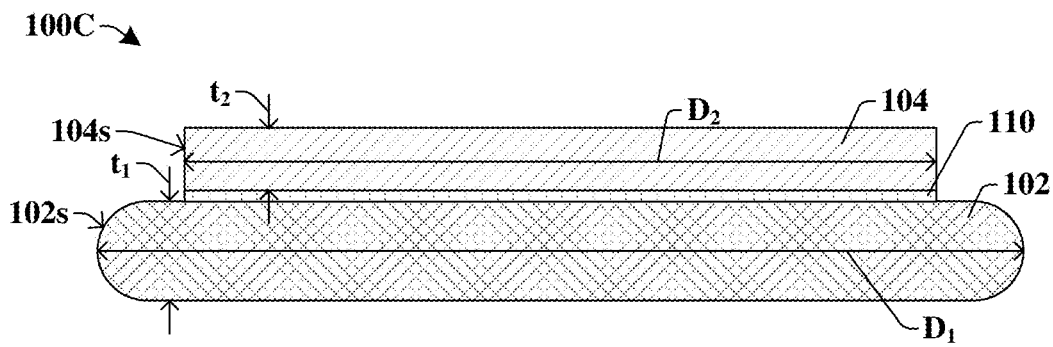

FIG. 1C illustrates a cross-sectional view 100C of some embodiments of the second wafer 104 arranged over and bonded to the first wafer 102. In some embodiments, the cross-sectional view 100C of FIG. 1C corresponds to a cross-sectional view of the top-view 100B in FIG. 1B and/or the perspective view 100A of FIG. 1A.

In some embodiments, a bonding layer 110 is arranged directly between the first wafer 102 and the second wafer 104. In some embodiments, the bonding layer 110 comprises an adhesive material used to aid in the bonding of the first wafer 102 to the second wafer 104. In some embodiments, the bonding layer 110 comprises and oxide, such as silicon dioxide or silicon oxynitride, for example. In some embodiments, the bonding layer 110 also has the second diameter $D_2$, whereas in other embodiments, the bonding layer 110 is wider than or narrower than the second wafer 104. Further, in some embodiments, the bonding layer 110 has a thickness in a range of between, for example, approximately 1 nanometer and approximately 1 micrometer.

In some embodiments, the first wafer 102 has a first thickness $t_1$, and the second wafer 104 has a second thickness $t_2$. In some embodiments, because the second wafer 104 undergoes a grinding process during the wafer edge trimming process, the second thickness $t_2$ of the second wafer 104 is less than the first thickness $t_1$ of the first wafer 102. In some embodiments, the second thickness $t_2$ of the second wafer 104 may be in a range of between, for example, approximately 1 micrometer to approximately 500 micrometers.

Figure 2:
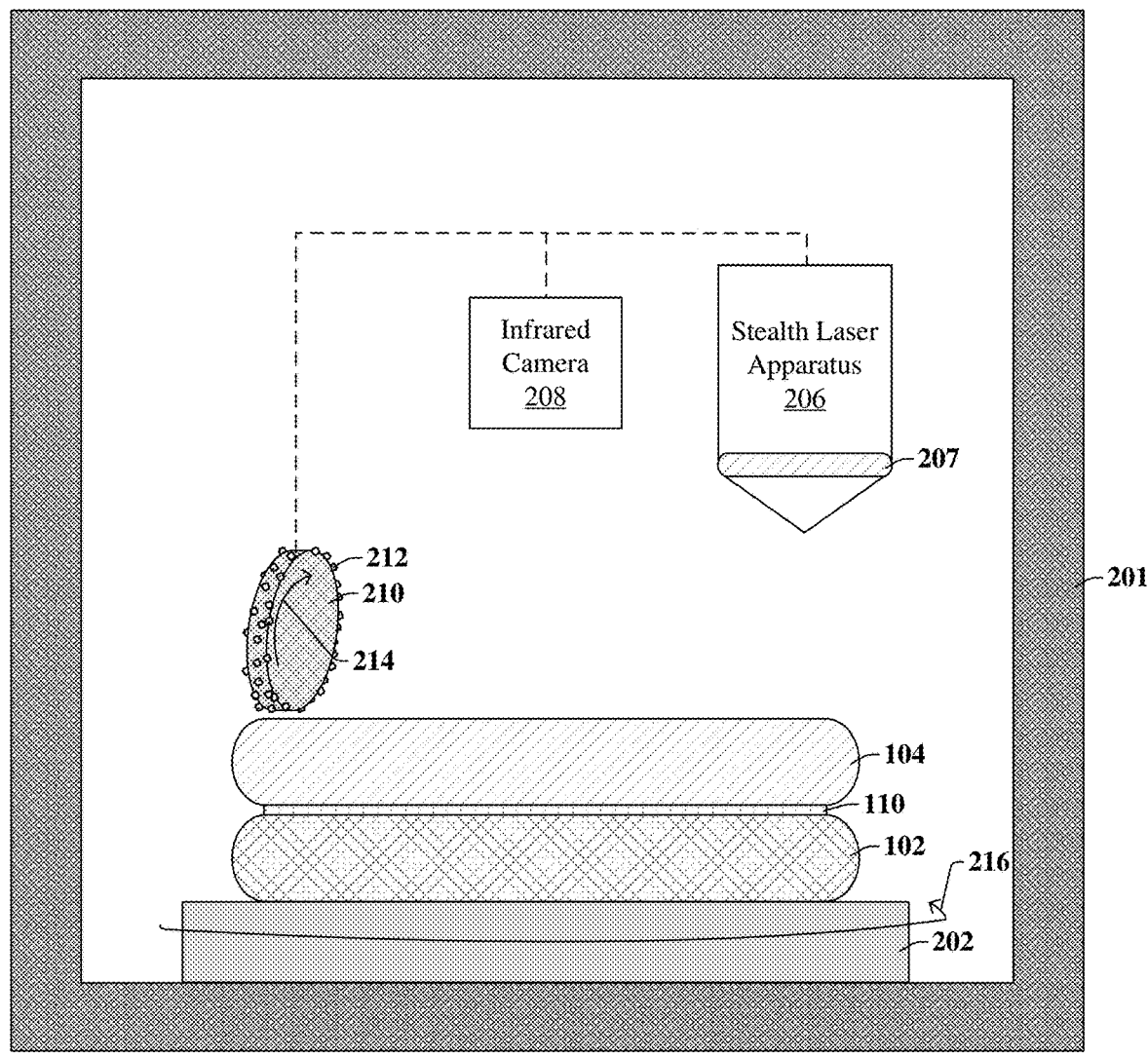
FIG. 2 illustrates a cross-sectional view of some embodiments of a wafer trimming apparatus comprising an infrared camera, a stealth laser apparatus, and a blade configured to remove an outer region of a second wafer.

FIG. 2 illustrates a cross-sectional view 200 of some embodiments of a wafer trimming apparatus comprising various apparatuses configured to remove an outer region of a second wafer during a wafer edge trimming process.

The cross-sectional view 200 of FIG. 2 includes an infrared camera 208, a stealth laser apparatus 206, and a blade 210. In some embodiments, the aforementioned apparatuses (e.g., 206, 208, 210) are arranged within a processing chamber defined by a chamber housing 201. In some other embodiments, each apparatus (e.g., 206, 208, 210) may be arranged in different chamber housings (e.g., 201). For example, in some other embodiments, the stealth laser apparatus 206 and the infrared camera 208 is in a first chamber housing (e.g., 201); and the blade 210 and an additional infrared camera (e.g., 208) is in a second chamber housing (e.g., 201).

In some embodiments, the stealth laser apparatus 206 is coupled to the infrared camera 208, and the blade 210 is coupled to the infrared camera 208. In some other embodiments, the stealth laser apparatus 206 is coupled to a different infrared camera 208 than the blade 210. In some embodiments, the infrared camera 208 is configured to locate first alignment marks (e.g., 106 of FIG. 1B) on or within a first wafer 102 arranged within the chamber housing 201 to align the stealth laser apparatus 206 and/or the blade 210 near an edge of the first and/or second wafers 102, 104. The infrared camera 208 is able to use an infrared signal that penetrates through the first and/or second wafers 102, 104 to locate the first alignment marks (e.g., 106 of FIG. 1B). In some embodiments, by using the infrared camera 208, accuracy of aligning the stealth laser and/or the blade 210 on the first and/or second wafers 102, 104 is within about 3 micrometers, for example.

In some embodiments, a wafer chuck 202 is arranged at a bottom of the chamber housing 201 within the processing chamber in order and is configured to hold a wafer such as, for example, the first and second wafers 102, 104. Further, in some embodiments, the wafer chuck 202 may be configured to rotate 216 during various steps of the wafer trimming process.

In some embodiments, the stealth laser apparatus 206 is configured to create a stealth damage (SD) region within the second wafer 104. In some embodiments, the stealth laser apparatus 206 is coupled to control circuitry that operates the stealth laser apparatus 206 and controls the depth at which the SD region is formed at within the second wafer 104. In some embodiments, the stealth laser apparatus 206 comprises a lens 207 that focuses pulses of the stealth laser to effectively form the SD region at a desired depth within the second wafer 104. In some embodiments, the wafer chuck 202 rotates 216 as the stealth laser apparatus 206 is "ON" and forms the SD region around the second wafer 104. In other embodiments, the wafer chuck 202 may remain stationary while the stealth laser apparatus 206 rotates around the second wafer 104.

In some embodiments, the blade 210 comprises an abrasive surface 212 such as, for example, a diamond grit. In some embodiments, the blade 210 is configured to rotate 214 as it removes an outer region of the second wafer 104 defined by the SD region. In some embodiments, the wafer chuck 202 is configured to rotate 216 as the blade 210 is "ON" and rotating 214 to remove the outer region of the second wafer 104. In some embodiments, the blade 210 is coupled to control circuitry that operates the blade 210 and controls various parameters (e.g., rotation per minute, location of the blade 210, etc.) of the blade 210 during operation. In some embodiments, the blade 210 is also configured to force the formation of a groove that extends completely through the second wafer 104 based on the SD region. Thus, the blade 210 may remove the outer region of the second wafer 104 without directly contacting an inner region of the second wafer 104 to mitigate damage to the second wafer 104 from the abrasive surface 212 of the blade 210.

FIGS. 3-14B illustrate various views 300-1400B of some embodiments of a method of performing a wafer edge trimming process with a stealth laser apparatus to mitigate damage to the trimmed wafer. Although FIGS. 3-14B are described in relation to a method, it will be appreciated that the structures disclosed in FIGS. 3-14B are not limited to such a method, but instead may stand alone as structures independent of the method.

Figure 3:
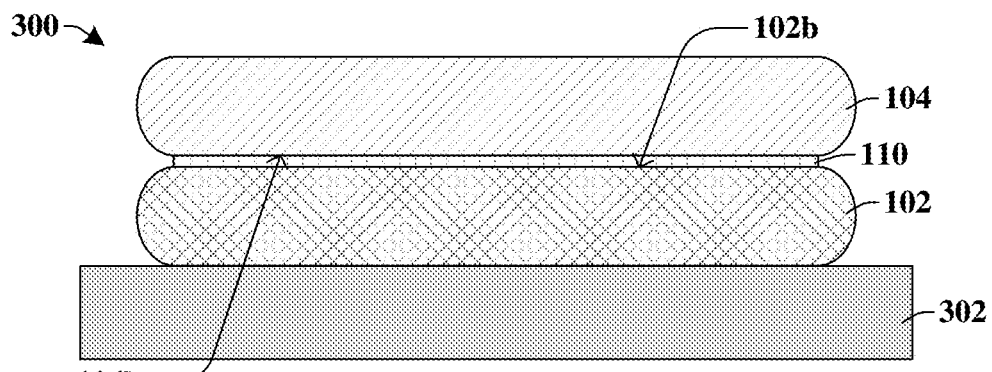
FIGS. 3-14B illustrate various views of some embodiments of a method of removing an outer region of a second wafer, wherein the second wafer is bonded to a first wafer, using a stealth laser apparatus to mitigate damage to the first and second wafers.

As shown in cross-sectional view 300 of FIG. 3, in some embodiments, a second wafer 104 is arranged over and bonded to a first wafer 102 on a bonding wafer chuck 302. In some embodiments, the first and/or second wafers 102, 104 may each be or comprise any type of semiconductor wafer (e.g., silicon/CMOS bulk, SiGe, SOI, etc). In some embodiments, the first and/or second wafers 102, 104 may also have semiconductor devices and/or metal routing arranged on or within the first and/or second wafers 102, 104. For example, in some embodiments, semiconductor devices may be arranged on or within the first wafer 102, and semiconductor devices may be arranged on or within the second wafer 104. In some embodiments, first metal routing connections may be arranged on a first bonding surface 102b of the first wafer 102, and second metal routing connections may be arranged on a second bonding surface 104b of the second wafer 104. Thus, in such embodiments, the first and second metal routing connections arranged on the first and second bonding surfaces 102b, 104b may connect to one another during the bonding of the first and second wafers 102, 104 such that semiconductor devices on the first wafer 102 are coupled to semiconductor devices on the second wafer 104. Examples of the first and second metal routing connections include solder bumps, wires, or the like.

Further, in some embodiments, a bonding layer 110 is arranged between the first and second wafers 102, 104 to ensure that the first wafer 102 is reliably bonded to the second wafer 104. In some embodiments, the bonding layer 110 may be formed on the first wafer 102 through a thermal oxidation or a deposition process (e.g., physical vapor deposition (PVD), chemical vapor deposition (CVD), atomic layer deposition (ALD), etc.). In some embodiments, the bonding layer 110 may comprise, for example, an oxide (e.g., silicon dioxide, silicon oxynitride) or some other suitable dielectric material. Then, in some embodiments, the second wafer 104 may be bonded to the first wafer 102 through the bonding layer 110 by way of pressure and/or temperature changes, for example. In some embodiments, the bonding layer 110 has a thickness in a range of between, for example, approximately 1 nanometer and approximately 1 micrometer.

It will be appreciated that other materials and methods of forming the bonding layer 110 are also within the scope of the disclosure. Further, it will be appreciated that other methods for bonding the first wafer 102 to the second wafer 104 are also within the scope of the disclosure.

Figure 4:
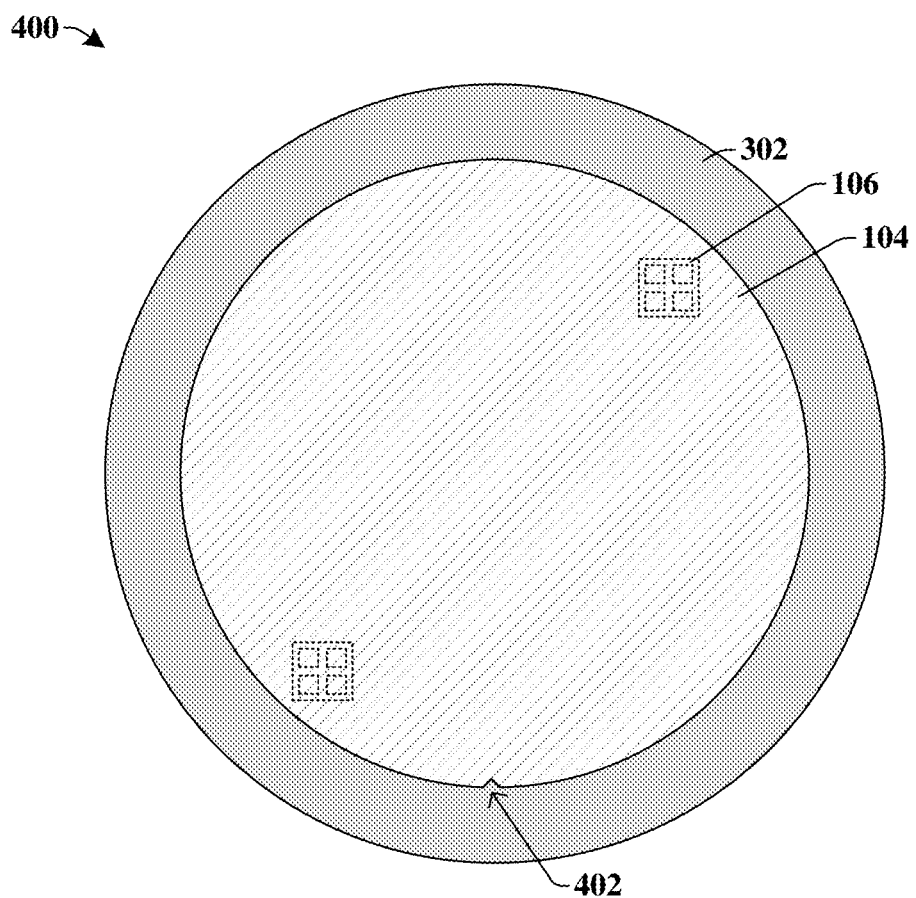

FIG. 4 illustrates a top-view 400 of some embodiments corresponding to the cross-sectional view 300 of FIG. 3.

In some embodiments, the first wafer (102 of FIG. 3) comprises first alignment marks 106. The first alignment marks 106 are illustrated with dotted lines, as it will be appreciated that the first alignment marks 106 on the first wafer (102 of FIG. 3) are not visible from the top-view 400 of FIG. 4. In such embodiments, the first alignment marks 106 were formed on the first wafer (102 of FIG. 3) prior to the bonding of the first and second wafers 102, 104. In such embodiments, the first alignment marks 106 may have been used for alignment of patterning equipment over the first wafer (102 of FIG. 3) during manufacturing. In some embodiments, the first alignment marks 106 may be or comprise a different material than the first wafer (102 of FIG. 3). Further, in some embodiments, there may be more or less than two of the first alignment marks 106 on the first wafer (102 of FIG. 3).

In some embodiments, the second wafer 104 comprises a second notch 402. The second notch 402 may be an indentation in an edge of the second wafer 104. In some embodiments, the second notch 402 also is used for alignment of patterning equipment and/or alignment of the second wafer 104 over the bonding wafer chuck 302, for example, during manufacturing. In some embodiments, the second notch 402 has an overall triangular-shape, a rounded-shape, or the like. Further, in some embodiments, the first wafer (102 of FIG. 3) comprises a first wafer notch (e.g., 108 of FIG. 1B) that is arranged directly below the second notch 402. In addition, in some embodiments, a center of the second wafer 104 is arranged directly over a center of the first wafer (102 of FIG. 3) such that the first and second wafers 102, 104 are aligned from the bonding process. In such embodiments, the first wafer (102 of FIG. 3) may not be visible from the top-view 400 of FIG. 4.

Figure 5:
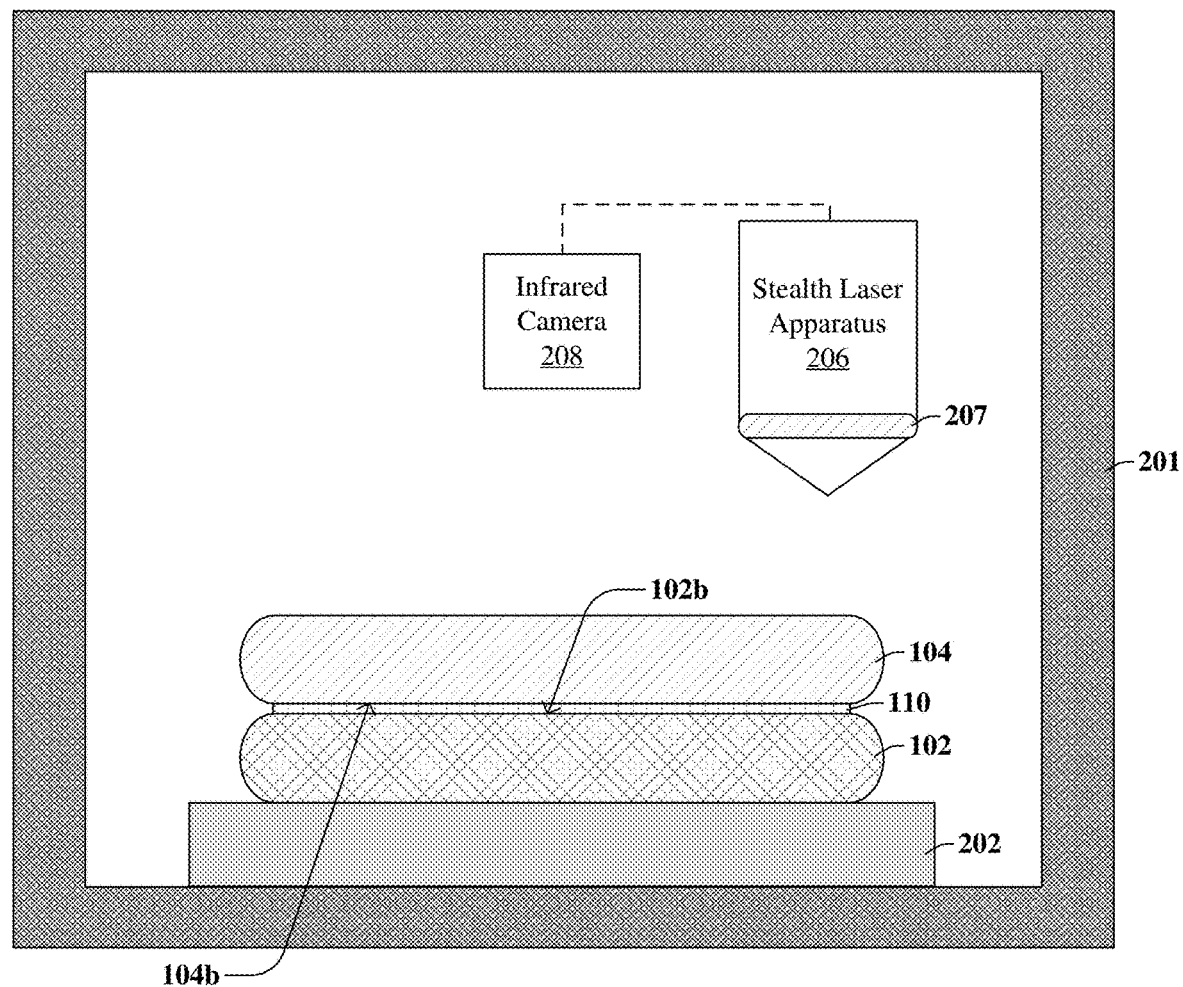

As shown in cross-sectional view 500 of FIG. 5, in some embodiments, the first and second wafers 102, 104 are then transported into a processing chamber defined by a chamber housing 201 and onto a wafer chuck 202 arranged in the processing chamber at a bottom of the chamber housing 201. In such embodiments, the first and second wafers 102, 104 remain aligned with one another during transportation because they are bonded to one another. Further, in some embodiments, the first and second wafers 102, 104 may be aligned over the wafer chuck 202 using the first notch (e.g., FIG. 1B, 108) of the first wafer 102 and the second notch (402 of FIG. 4) of the second wafer 104.

In some embodiments, a stealth laser apparatus 206 and an infrared camera 208 are arranged over the second wafer 104 and within the chamber housing 201. In some embodiments, the infrared camera 208 is coupled to the stealth laser apparatus 206 through a direct wired connection or wirelessly. In some embodiments, the stealth laser apparatus 206 also comprises a lens 207 configured to focus a stealth laser towards a desired area on or within the second wafer 104.

Figure 6:
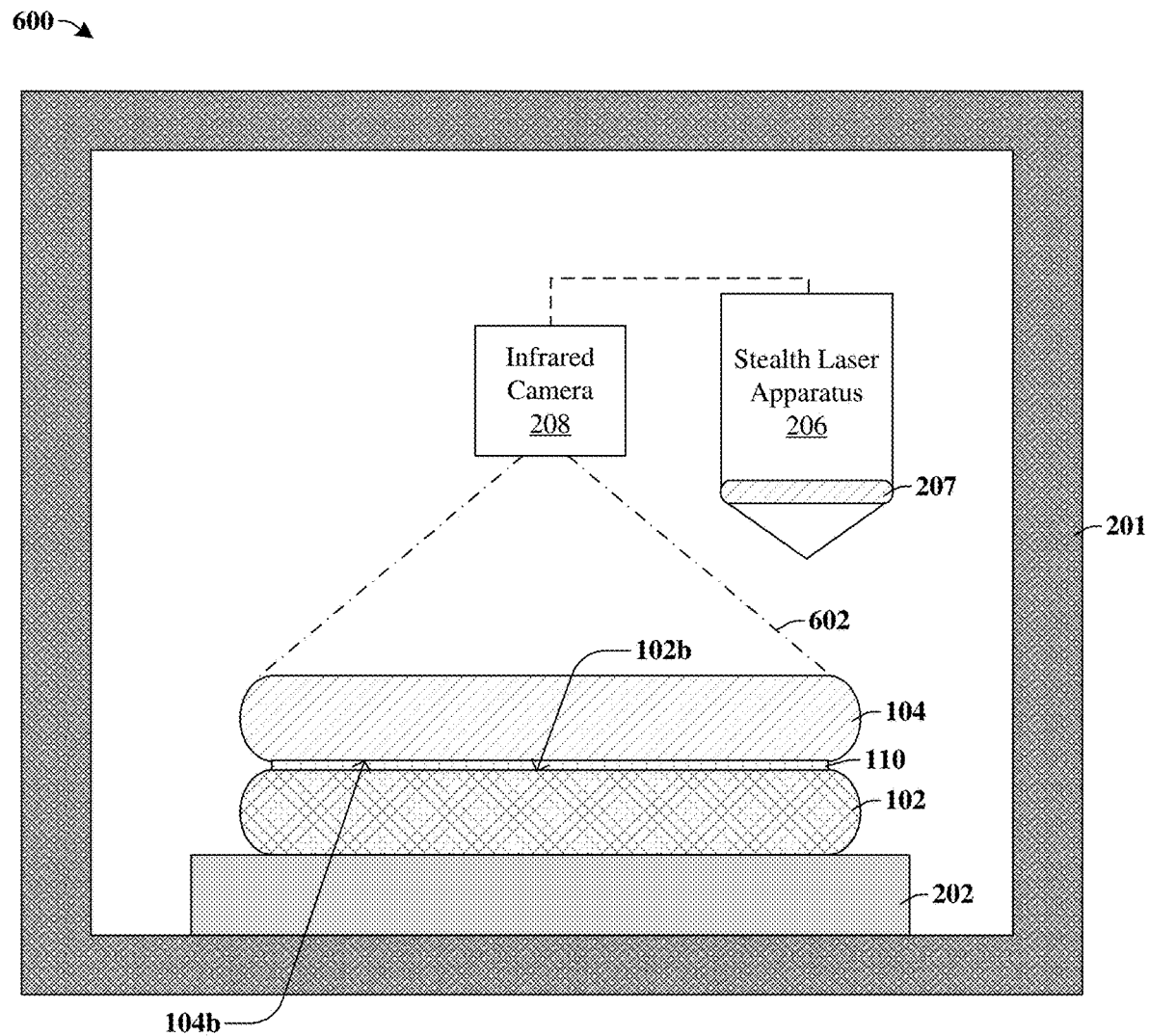

As shown in cross-sectional view 600 of FIG. 6, in some embodiments, the infrared camera 208 is turned "ON" by using an infrared signal to analyze 602 the first wafer 102 to locate the first alignment marks (106 of FIG. 4) of the first wafer 102. In some embodiments, the infrared signal of the infrared camera 208 may penetrate through the first and/or second wafers 102, 104 and still be able to locate the first alignment marks (106 of FIG. 4) of the first wafer 102. Based on the location of the first alignment marks (106 of FIG. 4) identified by the infrared camera 208, the stealth laser apparatus 206 may be reliably aligned over the second wafer 104. In some embodiments, the infrared camera 208 also locates the first notch (108 of FIG. 1B) and/or the second notch (402 of FIG. 4) to align the stealth laser apparatus 206 over the second wafer 104. Further, in some embodiments, the second wafer 104 may comprise second alignment marks (not shown) that may be identified by the infrared camera 208 to align the stealth laser apparatus 206 over the second wafer 104.

In some embodiments, by using the infrared camera 208 to align the stealth laser apparatus 206 through infrared alignment, accuracy of the alignment of the stealth laser apparatus 206 may be within 3 micrometers, for example, of a desired location on the second wafer 104. Further, because the infrared camera 208 advantageously uses the first alignment mark (106 of FIG. 4) that were already present on the first wafer 102 to align the stealth laser apparatus 206 over the second wafer 104, manufacturing efficiency is increased because new markings for the infrared camera 208 are not needed.

Figure 7:
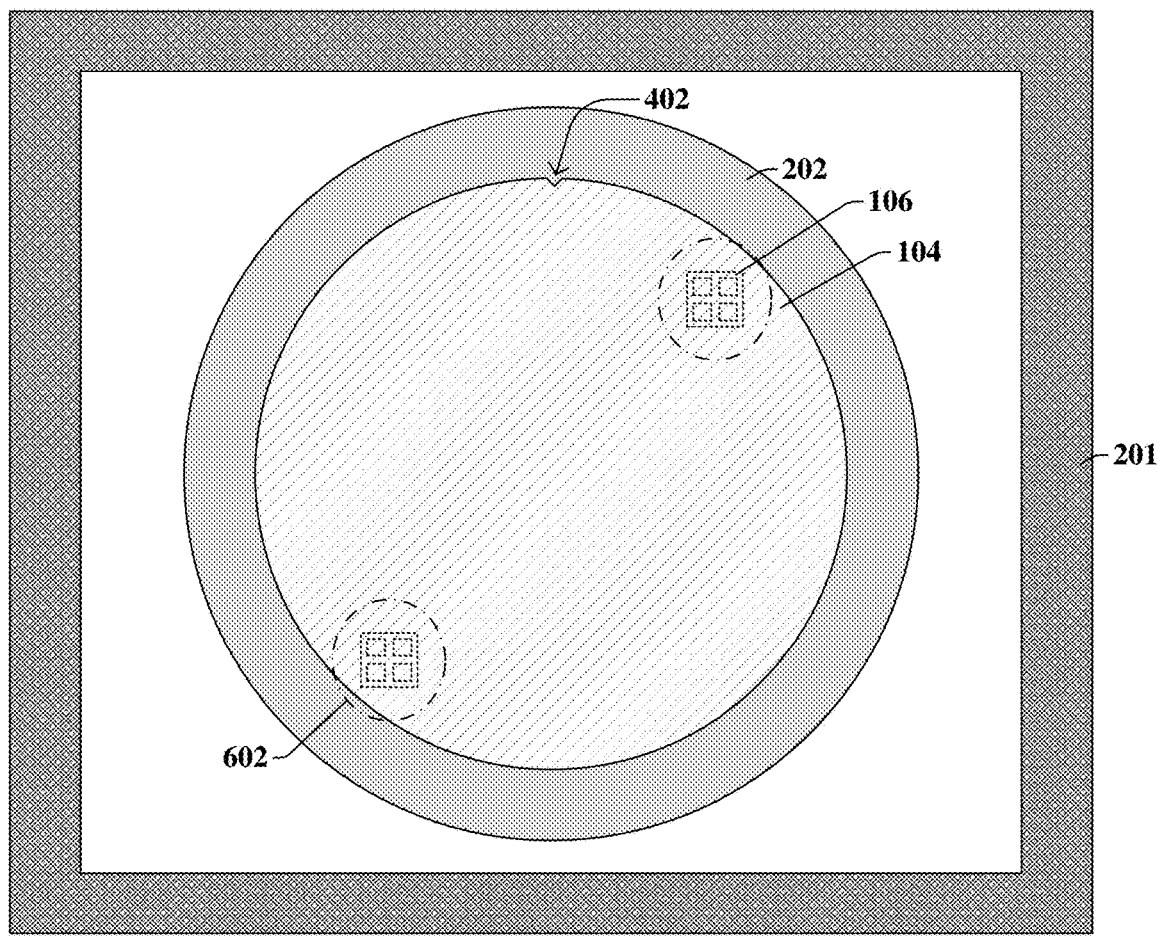

FIG. 7 illustrates a top-view 700 of some embodiments corresponding to the cross-sectional view 600 of FIG. 6.

As shown in the top-view 700 of FIG. 7, the infrared camera (208 of FIG. 6) may analyze 602 the first wafer (102 of FIG. 6) and/or the second wafer 104 to locate the first alignment marks 106. In such embodiments, an edge and/or center of the second wafer 104 may then be identified based on the location of the first alignment marks 106. Therefore, in such embodiments, the stealth laser apparatus (206 of FIG. 6) may be reliably aligned at a desired distance from the edge of the second wafer 104.

Figure 8:
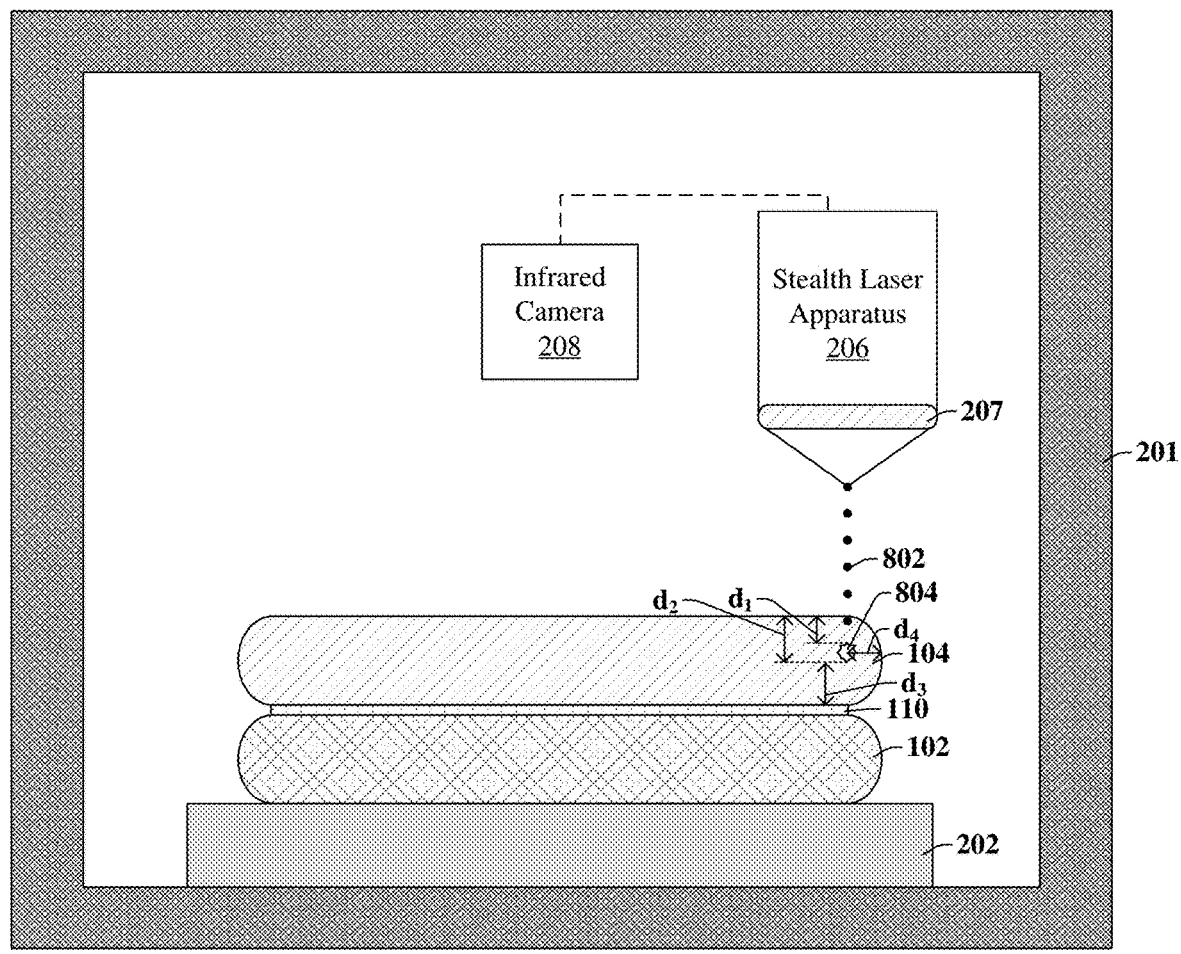

As shown in cross-sectional view 800 of FIG. 8, after aligning the stealth laser apparatus 206 over the second wafer 104, the stealth laser apparatus 206 applies a stealth laser pulses 802 within the second wafer 104 to form a stealth damage (SD) region 804 within the second wafer 104 and between upper and lower surfaces of the second wafer 104. In some embodiments, the stealth laser apparatus 206 is controlled by control circuitry coupled to the stealth laser apparatus 206. Further, in some embodiments, the lens 207 of the stealth laser apparatus 206 aids in focusing the stealth laser pulses at a desired location within the second wafer 104.

In some embodiments, the SD region 804 is arranged within the second wafer 104 from a first distance $d_1$ below the upper surface of the second wafer 104 to a second distance $d_2$ below an upper surface of the second wafer 104. A bottom of the SD region 804 is arranged at a third distance $d_3$ above the lower surface of the second wafer 104. In some embodiments, the third distance $d_3$ is greater than 10 micrometers.

Further, in some embodiments, the SD region 804 is arranged at a fourth distance $d_4$ from an edge of the second wafer 104. Because of the infrared camera 208 and infrared alignment process, the fourth distance $d_4$ may be within 3 micrometers of the desired fourth distance $d_4$. Further, in some embodiments, because the infrared camera 208 and the infrared alignment process are so accurate and precise, the fourth distance $d_4$ may be in a range of between, for example, approximately 0.1 millimeters and approximately 1 millimeter.

Figure 9:
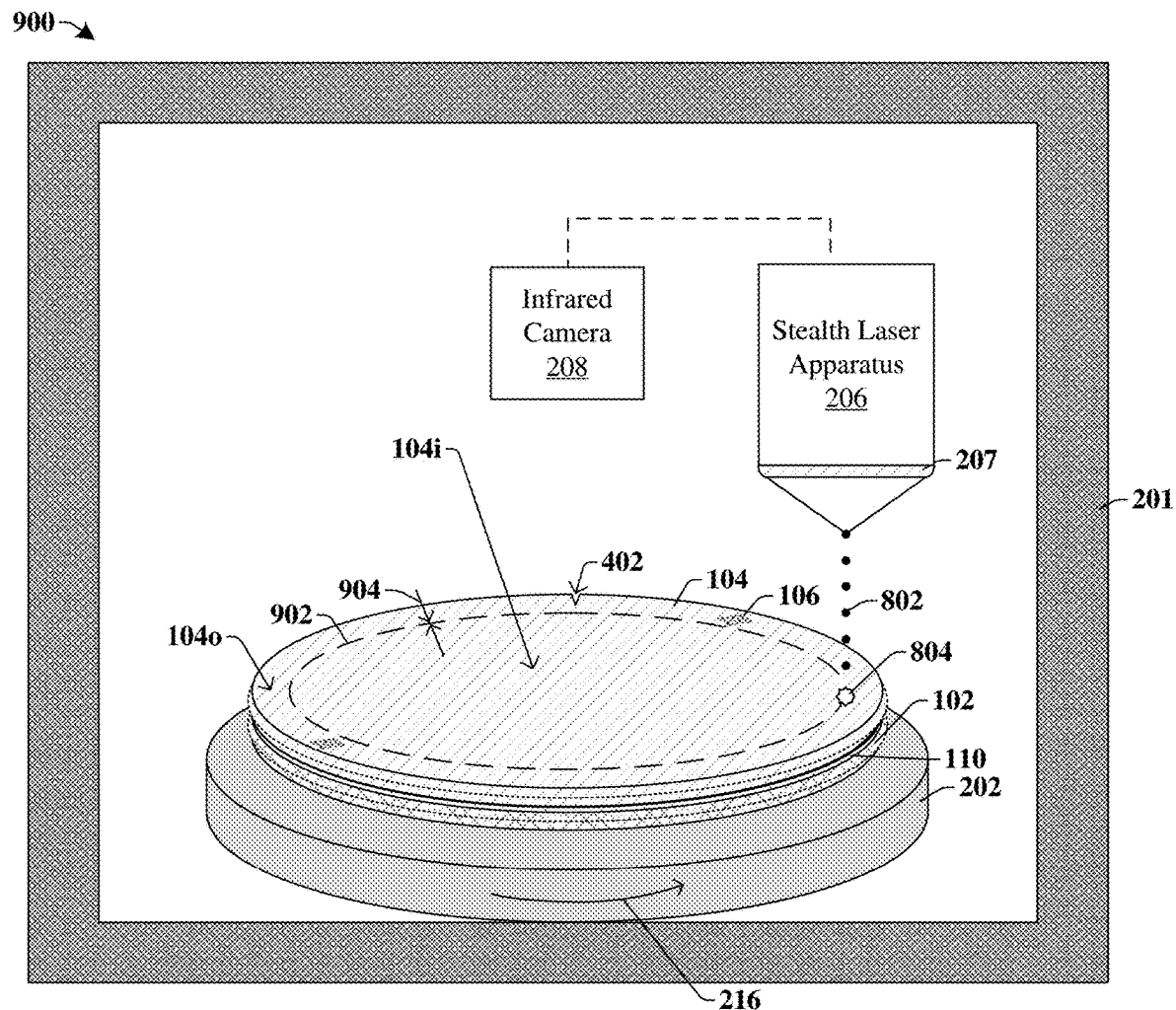

As shown in perspective view 900 of FIG. 9, in some embodiments, the stealth laser apparatus 206 continues to apply the stealth laser pulses 802 within the second wafer 104 as the second wafer 104 is rotated to form a SD region 902. In some embodiments, the wafer chuck 202 is configured to rotate 216 as the stealth laser apparatus 206 is stationary and applies the stealth laser pulses 802 to the second wafer 104, whereas in other embodiments, the wafer chuck 202 remains stationary as the stealth laser apparatus 206 rotates and applies the stealth laser pulses 802 to the second wafer 104. Nevertheless, the stealth laser apparatus 206 may form many SD regions 804 around the second wafer 104 thereby forming the SD region 902 within the second wafer 104 that is a continuously connected region of damage within the second wafer 104. It will be appreciated that the SD region 902 is illustrated in the perspective view 900 of FIG. 9.

In some embodiments, the SD region 902 defines an inner region 104i of the second wafer 104 from an outer region 104o of the second wafer 104. The outer region 104o may have a substantially ring-like shape with an inner perimeter and an outer perimeter, wherein the outer perimeter is the edge of the second wafer 104, and wherein the inner perimeter is defined by the SD region 902. However, because the SD region 902 is arranged within the second wafer 104, the inner region 104i of the second wafer 104 is still connected to the outer region 104o of the second wafer. In some embodiments, the outer region 102o of the second wafer 104 includes the second notch 402. In other embodiments, the outer region 102o does not include the second notch 402.

In some embodiments, the SD region 902 has a kerf width 904 that is between approximately 1 nanometer and approximately 2 micrometers. Because the kerf width 904 of the SD region 902 is substantially small, the precision and accuracy of the SD region 902 at a desired location within the second wafer 104 is increased. Thus, because of the small kerf width 904 and also because of the precision and accuracy provided by the infrared alignment process, the area of the outer region 104o of the second wafer 104 is minimized (e.g., $d_4$ of FIG. 8 is less than 1 millimeter) such that the area of the inner region 104i of the second wafer 104 is maximized. Thus, more devices may be formed on the inner region 104i of the second wafer 104 and less materials and space is wasted.

Figure 10:
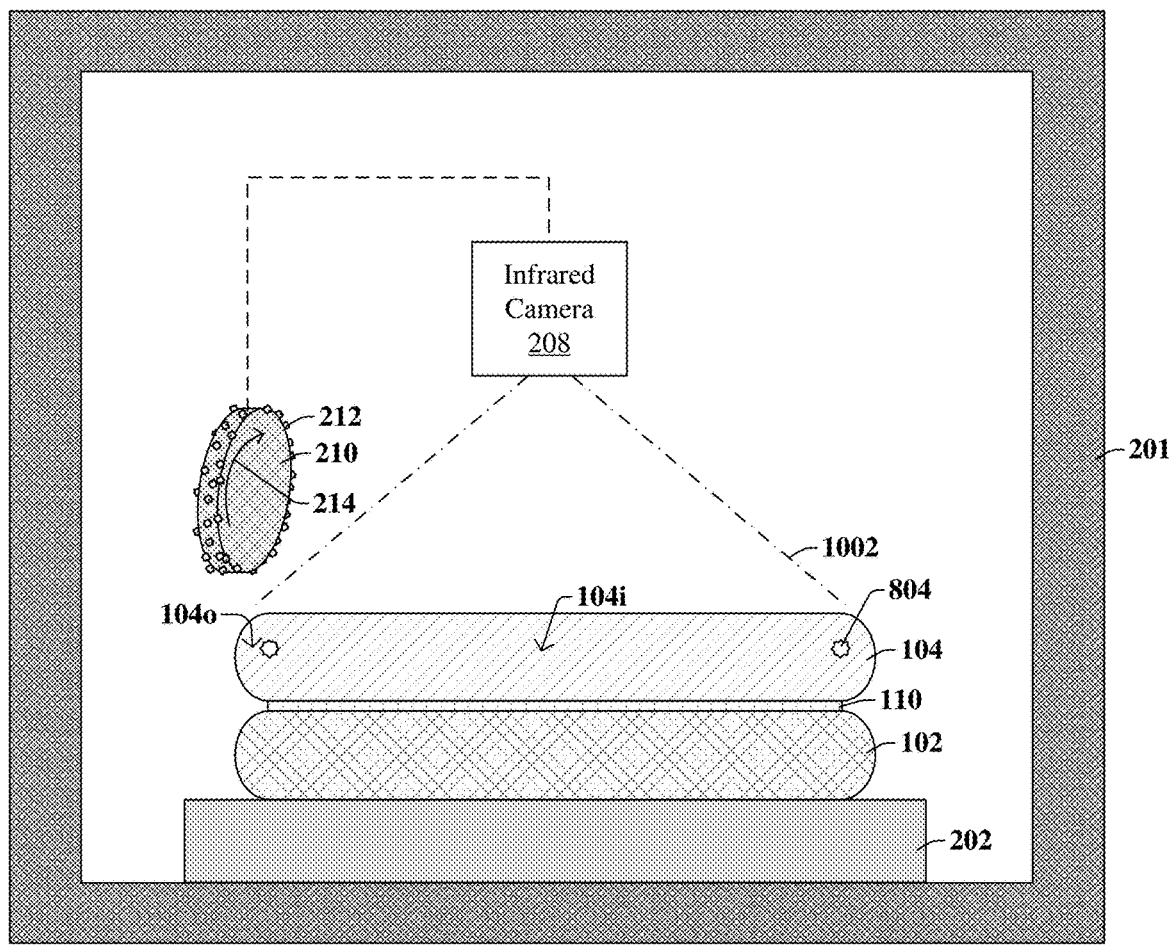

As shown in cross-sectional view 1000 of FIG. 10, in some embodiments, the infrared camera 208 is also coupled to a blade 210 within the processing chamber defined by the chamber housing 201. In some embodiments, the blade 210 comprises an abrasive surface 212 and is configured to rotate 214 when turned "ON" to remove the outer region 104o of the second wafer 104 from the inner region 104i of the second wafer 104. In such embodiments, the infrared camera 208 may again analyze 1002 the first and second wafers 102, 104 to locate the first alignment marks (106 of FIG. 4) of the first wafer 102. The analysis 1002 of the first and second wafers 102, 104 by the infrared camera 208 may comprise the same or similar steps as described in FIGS. 6 and 7. Then, in some embodiments, the blade 210 may be aligned over the second wafer 104 according to the location of the first alignment marks (106 of FIG. 4) as identified by the infrared camera 208. In other embodiments, analyzing 1002 the first and second wafers 102, 104 in FIG. 10 is unnecessary, and the blade 210 may be aligned based on the analysis (602 of FIG. 6) by the infrared camera 208 conducted previously in FIG. 6.

It will be appreciated that in some other embodiments, the blade 210 and infrared camera 208 may be arranged within a different processing chamber than the processing chamber that the stealth laser apparatus (206 of FIG. 9) and processes associated therewith was used in.

Figure 11A:
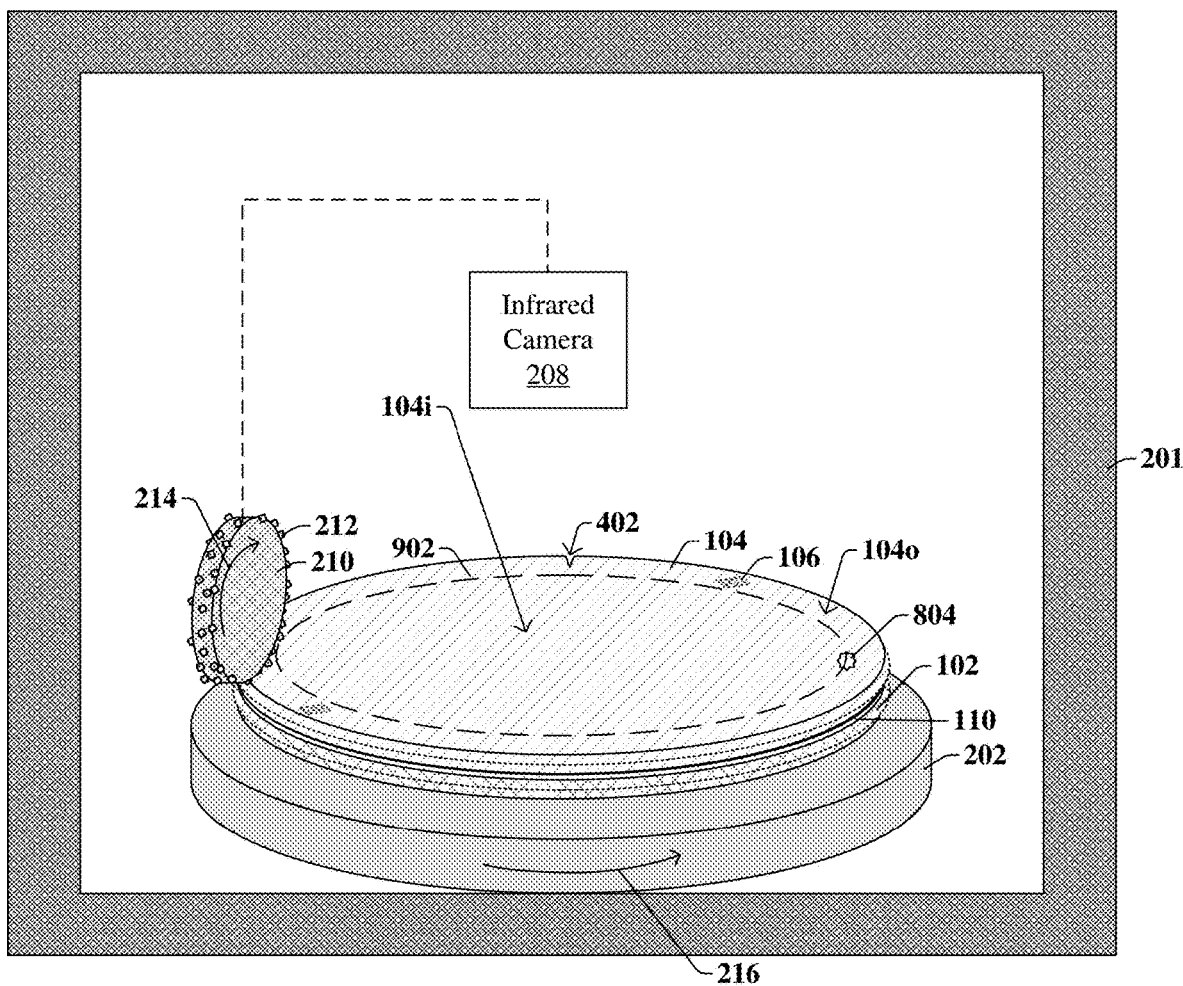

As shown in perspective view 1100A of FIG. 11A, in some embodiments, the blade 210 is configured to rotate 214 to remove the outer region 104o of the second wafer 104 during a blade trimming process. In some embodiments, the wafer chuck 202 is configured to rotate 216 as the blade 210 removes the outer region 104o of the second wafer 104. In other embodiments, the wafer chuck 202 remains stationary as the blade 210 rotates around the second wafer 104.

Figure 11B:
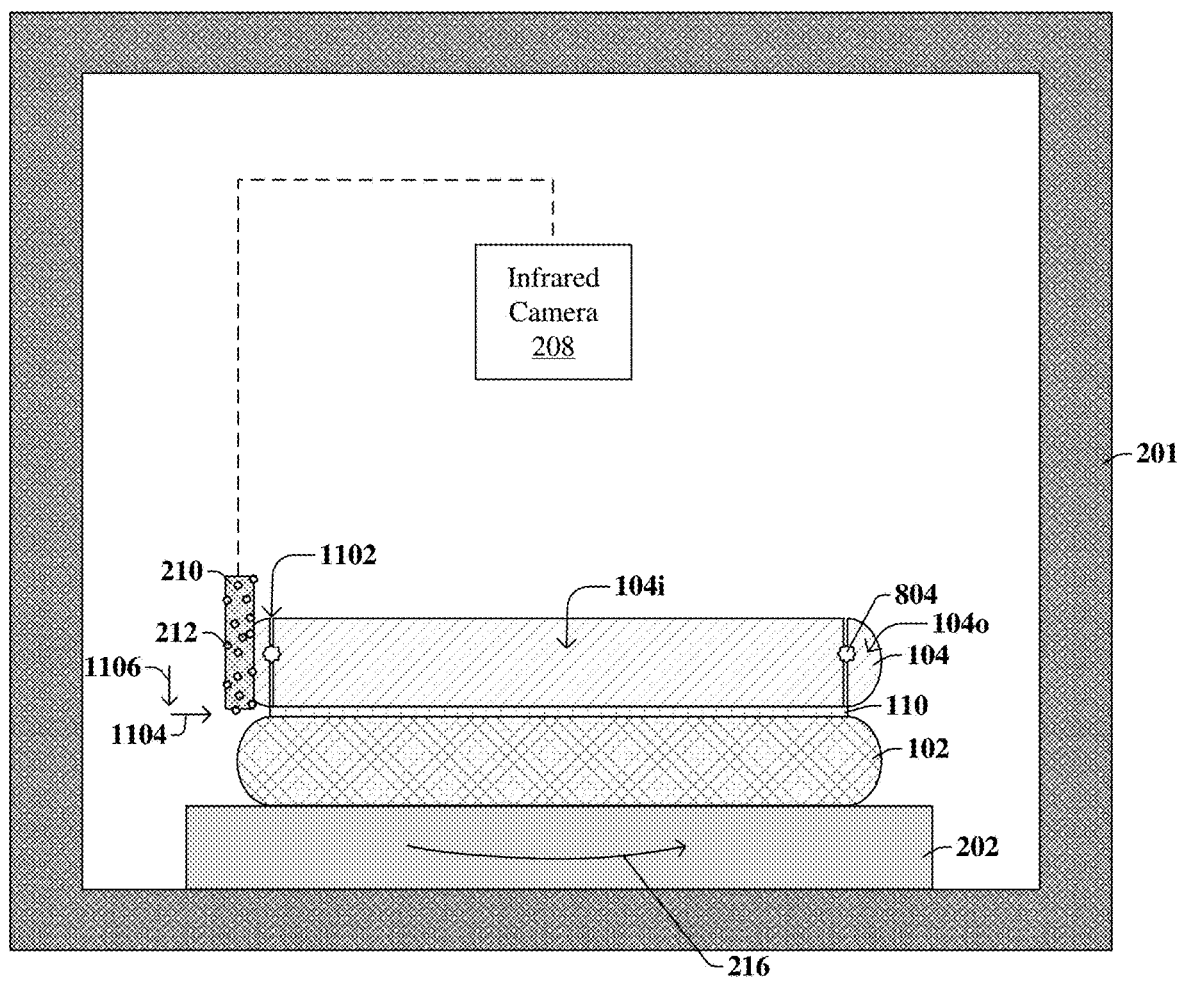

FIG. 11B illustrates a cross-sectional view 1100B of some embodiments corresponding to the perspective view 1100A of FIG. 11A after a first time period of the blade trimming process.

As shown in the cross-sectional view 1100B of FIG. 11B, in some embodiments, the blade 210 is configured to move in a horizontal direction 1104 that is normal to an edge of the second wafer 104 and is configured to move in a vertical direction 1106 that is normal to an upper surface of the second wafer 104. Further, the horizontal direction 1104 is perpendicular to the vertical direction 1106.

In some embodiments, as the blade 210 begins to remove the outer region 104o of the second wafer 104 from the inner region 104i of the second wafer 104, forces from the blade 210 cause a groove 1102 to form that completely separates the inner region 104i of the second wafer 104 from the outer region 104o of the second wafer 104. In such embodiments, the groove 1102 intersects with the SD region (902 of FIG. 11A)/the SD regions 804 of the SD region (902 of FIG. 11A). In other words, the groove 1102 may form due to propagation of cracks and/or crazing from the SD region (902 of FIG. 11A) and towards the upper and lower surfaces of the second wafer 104.

Figure 11C:
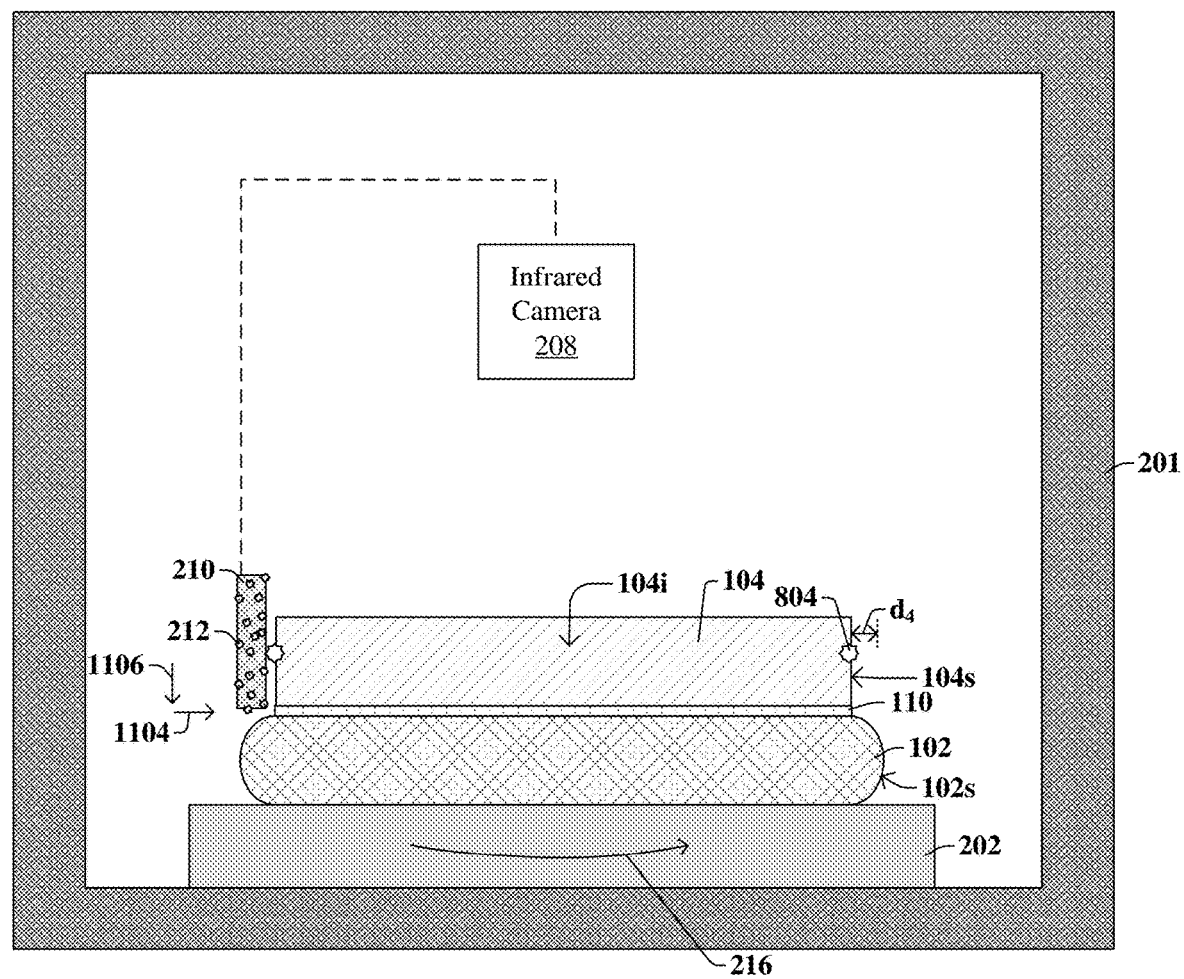

FIG. 11C illustrates a cross-sectional view 1100C of some embodiments corresponding to the cross-sectional view 1100B after a second time period that is after the first time period of the blade trimming process.

As shown in the cross-sectional view 1100C of FIG. 11C, in some embodiments, the blade 210 continues to remove the outer region (104o of FIG. 11B) of the second wafer 104 until the outer region (104o of FIG. 11B) is completely removed from the inner region 104i of the second wafer 104. Thus, at the end of the blade trimming process, the second wafer 104 comprises an outer sidewall 104s defined by the blade 210 and the SD region (902 of FIG. 11A). In some embodiments, a width of the outer region (104o of FIG. 11B) removed from the second wafer 104 is equal to the fourth distance $d_4$, which may be in a range of between, for example, approximately 0.1 millimeters and approximately 1 millimeter.

In some embodiments, because the groove (1102 of FIG. 11B) was formed from the SD region (902 of FIG. 11A), the blade 210 did not directly contact the inner region 104i of the second wafer 104. Thus, the blade 210 does not directly contact the outer sidewall 104s of the second wafer 104 defined by the blade 210 and SD region (902 of FIG. 11A). This way, in some embodiments, the outer sidewall 104s and also the upper surface of the second wafer 104 are not damaged by the abrasive surface 212 of the blade 210.

Further, in some embodiments, because the outer sidewall 104s of the second wafer 104 was defined by the blade 210 and the SD region (902 of FIG. 11A), the outer sidewall 104s of the second wafer 104 may be substantially straight or substantially vertical, whereas an outer sidewall 102s of the first wafer 102 may be substantially curved.

In some embodiments, the blade 210 also removes outer portions of the bonding layer 110 as the blade 210 rotates (214 of FIG. 11A) and moves in the vertical and horizontal directions 1104, 1106. In some embodiments, because the blade 210 doesn't directly contact the outer sidewall 104s of the second wafer 104, the blade 210 doesn't completely remove portions of the bonding layer 110 that are not arranged directly between the first and second wafers 102, 104. Thus, in some embodiments, the bonding layer 110 may be wider than the second wafer 104 after the blade trimming process.

Figure 12:
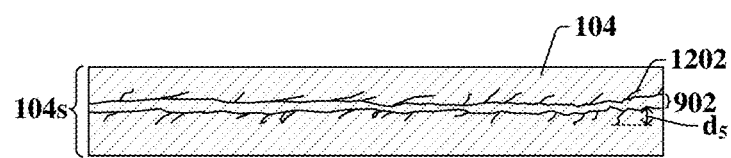

FIG. 12 illustrates a side view 1200 of some embodiments of the outer sidewall 104s of the second wafer 104 after the blade trimming process of FIGS. 11A-11C.

As illustrated in the side view 1200 of FIG. 12, in some embodiments, cracks 1202 propagated away from the SD region 902 due to forces from the blade (210 of FIG. 11B), thereby forming the groove (1102 of FIG. 11B). In such embodiments, the cracks 1202 extend above and below the SD region 902 by a fifth distance $d_5$. In some embodiments, the fifth distance $d_5$ is in a range of between, for example approximately 8 micrometers and approximately 12 micrometers. In some embodiments, portions of the outer sidewall 104s of the second wafer 104 that do not comprise the SD region 902 or the cracks 1202 are substantially smooth. In other words, the portions of the outer sidewall 104s of the second wafer 104 that do not comprise the SD region 902 or the cracks 1202 having a lower average surface roughness than the portions of the outer sidewall 104s of the second wafer 104 that do comprise the SD region 902 or the cracks 1202. In some embodiments, the average surface roughness of the portions of the outer sidewall 104s of the second wafer 104 that do not comprise the SD region 902 or the cracks 1202 is about equal to the average surface roughness of the upper surface of the second wafer 104.

In some embodiments, to measure average surface roughness, a roughness measurement tool (e.g., a profilometer, AFM) calculates a mean line along a surface and measures the deviation between the height of a peak or valley on the surface from the mean line. After measuring many deviations at many peaks and valleys throughout the surface, the average surface roughness is calculated by taking the mean of the many deviations, where the deviations are absolute values. In other embodiments, the average surface roughness is quantified by measuring a total thickness variation (TTV). The TTV of a layer is the difference between the smallest thickness and the largest thickness of the layer. The TTV is measured throughout the length of a layer.

Figure 13:
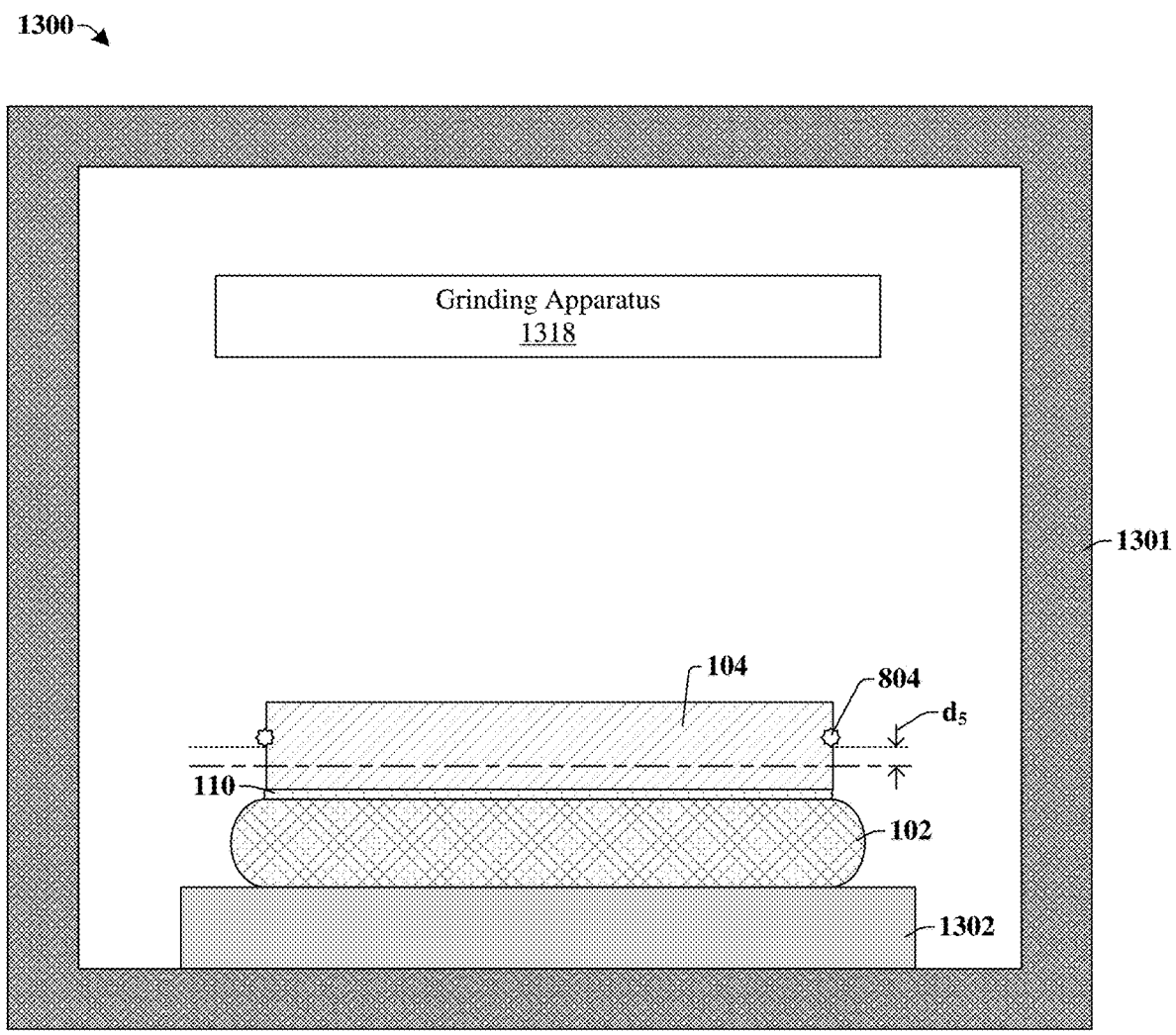

As illustrated in cross-sectional view 1300 of FIG. 13, in some embodiments, the first and second wafers 102, 104 are transported onto a grinding wafer chuck 1302 in a grinding housing 1301 comprising a grinding apparatus 1318. In some embodiments, the grinding apparatus 1318 is configured to reduce the thickness of the second wafer 104. In some embodiments, the grinding apparatus 1318 may be or comprise an apparatus used for chemical mechanical planarization (CMP). In some embodiments, the grinding apparatus 1318 comprises some kind of grinding wheel that has a diameter larger than a diameter of the second wafer 104. In some embodiments, operation and parameters of the grinding apparatus 1318 are controlled by control circuitry that is coupled to the grinding apparatus 1318.

In some embodiments, the grinding apparatus 1318 removes the SD regions 804 that make up the SD region (902 of FIG. 11A), as well as removes at least the fifth distance $d_5$ below the SD region (902 of FIG. 11A) that comprises defects (e.g., cracks 1202 of FIG. 12). Thus, in some embodiments, the SD region (902 of FIG. 11A) is arranged at least at a height equal to the fifth distance $d_5$ above the desired thickness of the second wafer 104 after a grinding process conducted by the grinding apparatus 1318.

Figure 14A:
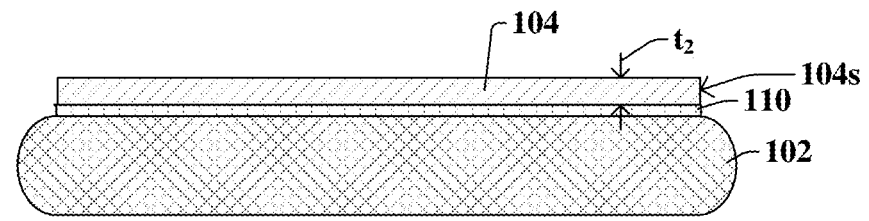

As illustrated in cross-sectional view 1400A of FIG. 14A, after the grinding process conducted by the grinding apparatus (1318 of FIG. 13), in some embodiments, the second wafer 104 has a thickness equal to a second thickness $t_2$. In some embodiments, the second thickness $t_2$ is in a range of between, for example, approximately 1 micrometer and approximately 500 micrometers. Further, in some embodiments, the second wafer 104 is thinner than the first wafer 102.

After the grinding process, the second wafer 104 may no longer comprise the SD region (902 of FIG. 11A) or any cracks (1202 of FIG. 12), in some embodiments. Thus, in some embodiments, the outer sidewalls 104s of the second wafer 104 may be substantially free of defects and have an average surface roughness less than or about equal to an average surface roughness of an upper surface of the second wafer 104 after the grinding process by the grinding apparatus (1318 of FIG. 13). Further, in some embodiments, the grinding process is a CMP process, and thus, the upper surface of the second wafer 104 may be substantially planar after the grinding process.

Figure 14B:
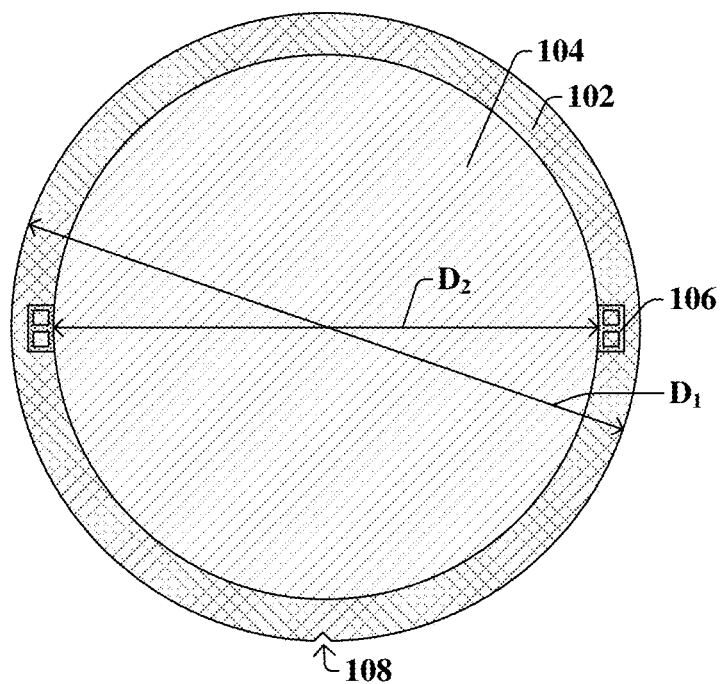

FIG. 14B illustrates a top-view 1400B of some embodiments corresponding to the cross-sectional view 1400A of FIG. 14A.

As illustrated in the top-view 1400B of FIG. 14B, in some embodiments, the second notch (402 of FIG. 11A) on the second wafer 104 may be completely removed by the blade (210 of FIG. 11C) during the wafer edge trimming process. In some embodiments, the second wafer 104 may completely or partially cover the first alignment marks 106 of the first wafer 102. In other embodiments, the second wafer 104 may not directly overlie the first alignment marks 106 of the first wafer 102 after the wafer edge trimming process.

Further, in some embodiments, after the wafer edge trimming process, the second wafer 104 has a second diameter $D_2$ that is less than a first diameter $D_1$ of the first wafer 102. In some embodiments, the difference between the first and second diameters $D_1$, $D_2$ is in a range of between approximately 0.2 millimeters and approximately 2 millimeters. Because the infrared camera (208 of FIG. 11C) is used to align the stealth laser apparatus (206 of FIG. 9) and the blade (210 of FIG. 10) on the second wafer 104, alignment precision and accuracy is increased which may reduce a difference in the first and second diameters $D_1$, $D_2$. Thus, more of the second wafer 104 may be used for device formation because less of the second wafer 104 is trimmed during the wafer edge trimming process.

Further, because of the wafer edge trimming process, peeling of the first and second wafers 102, 104 away from one another is mitigated during future processing steps such as dicing and packaging. Further, because the SD region (902 of FIG. 11A) prevents the blade (210 of FIG. 11A) from directly contacting the inner region (104i of FIG. 11A) of the second wafer 104, the remaining second wafer 104 in FIG. 14B has mitigated damage on its outer sidewalls and upper surfaces to increase reliability of the integrated chips formed from the first and second wafers 102, 104.

Figure 15:
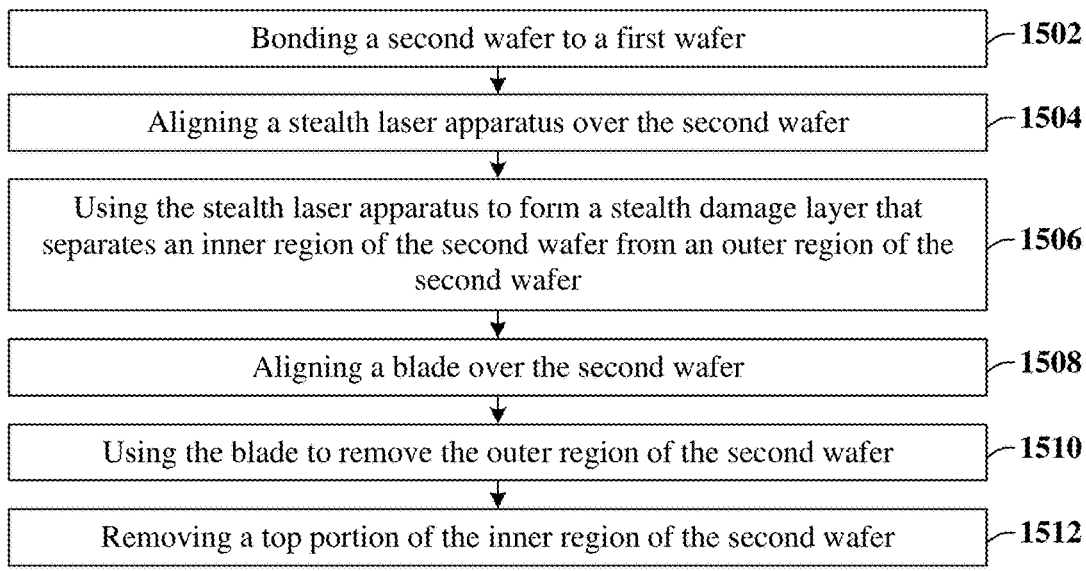
FIG. 15 illustrates a flow diagram of some embodiments of a method corresponding to FIGS. 3-14B.

FIG. 15 illustrates a flow diagram of some embodiments of a method 1500 of performing a wafer edge trimming process using a stealth laser apparatus to mitigate damage to a second wafer that is trimmed and overlies a first wafer.

While method 1500 is illustrated and described below as a series of acts or events, it will be appreciated that the illustrated ordering of such acts or events are not to be interpreted in a limiting sense. For example, some acts may occur in different orders and/or concurrently with other acts or events apart from those illustrated and/or described herein. In addition, not all illustrated acts may be required to implement one or more aspects or embodiments of the description herein. Further, one or more of the acts depicted herein may be carried out in one or more separate acts and/or phases.

At act 1502, a second wafer is bonded to a first wafer. FIG. 3 illustrates cross-sectional view 300 of some embodiments corresponding to act 1502.

At act 1504, a stealth laser apparatus is aligned over the second wafer. FIG. 6 illustrates cross-sectional view 600 of some embodiments corresponding to act 1504.

At act 1506, a stealth damage region that separates an inner region of the second wafer from an outer region of the second wafer is formed by using the stealth laser apparatus. FIG. 9 illustrates perspective view 900 of some embodiments corresponding to act 1506.

At act 1508, a blade is aligned over the second wafer. FIG. 10 illustrates cross-sectional view 1000 of some embodiments corresponding to act 1508.

At act 1510, the blade is used to remove the outer region of the second wafer. FIGS. 11B and 11C illustrate cross-sectional views 1100B and 1100C, respectively, of some embodiments corresponding to act 1510.

At act 1512, a top portion of the inner region of the second wafer is removed. FIGS. 13 and 14A illustrate cross-sectional views 1300 and 1400A, respectively, of some embodiments corresponding to act 1512.

Figure 16:
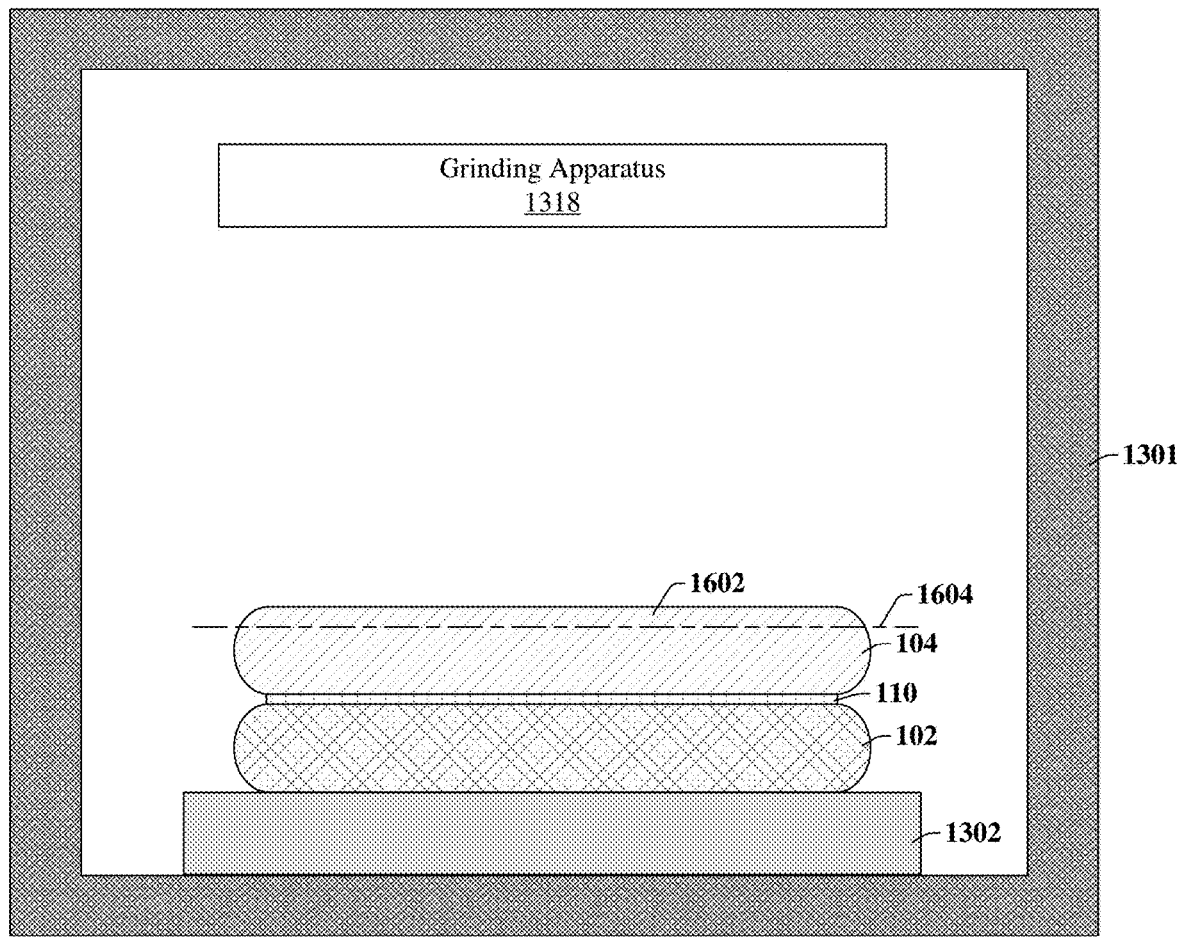
FIGS. 16 and 17 illustrate cross-sectional views of some additional embodiments of a method of removing an initial top portion of a second wafer before removing an outer region of the second wafer using a stealth laser apparatus to mitigate damage to the first and second wafers.
Figure 17:
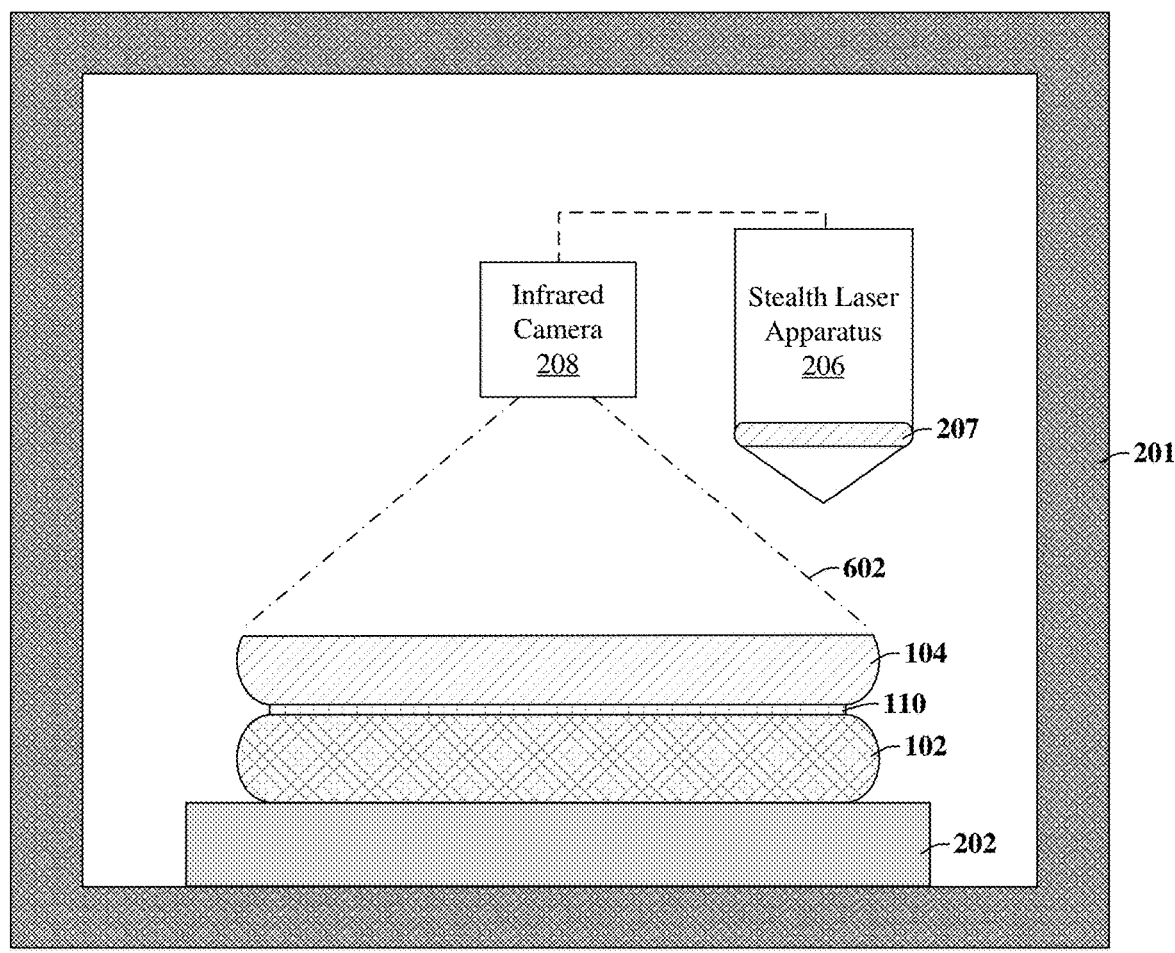

FIGS. 16 and 17 illustrate cross-sectional views 1600 and 1700, respectively, of some alternative embodiments of a method of performing a wafer edge trimming process with a stealth laser apparatus to mitigate damage to the trimmed wafer. Although FIGS. 16 and 17 are described in relation to a method, it will be appreciated that the structures disclosed in FIGS. 16 and 17 are not limited to such a method, but instead may stand alone as structures independent of the method.

FIG. 16 illustrates a cross-sectional view 1600 of some alternative embodiments of the wafer edge trimming process of FIGS. 3-14B, wherein an additional grinding process is performed prior to the formation of a stealth damage region (902 of FIG. 9).

Thus, in some embodiments, the wafer edge trimming process further includes an additional grinding process between the bonding of the first and second wafers 102, 104 in FIG. 3 and the aligning of the stealth laser apparatus 206 in FIG. 6. In such embodiments, the additional grinding process may remove an initial top portion 1602 of the second wafer 104. For example, in some embodiments, the grinding apparatus 1318 may conduct the additional grinding process to the additional grinding line 1604 of FIG. 16 to remove the initial top portion 1602 of the second wafer 104.

As illustrated in the cross-sectional view 1700 of FIG. 17, in some embodiments, after the additional grinding process of FIG. 16, the first and second wafers 102, 104 may be transported into the processing chamber defined by the chamber housing 201, and the method may process to FIG. 17, wherein the stealth laser apparatus 206 is aligned over the second wafer 104 using the infrared camera 208. Thus, in some embodiments, the cross-sectional view 1700 of FIG. 17 corresponds to and comprises the same steps as the cross-sectional view 600 of FIG. 6. Then, in some embodiments, the wafer edge trimming process comprising the additional grinding process may proceed from the cross-sectional view 1700 of FIG. 17 to the cross-sectional view 800 of FIG. 8.

Figure 18:
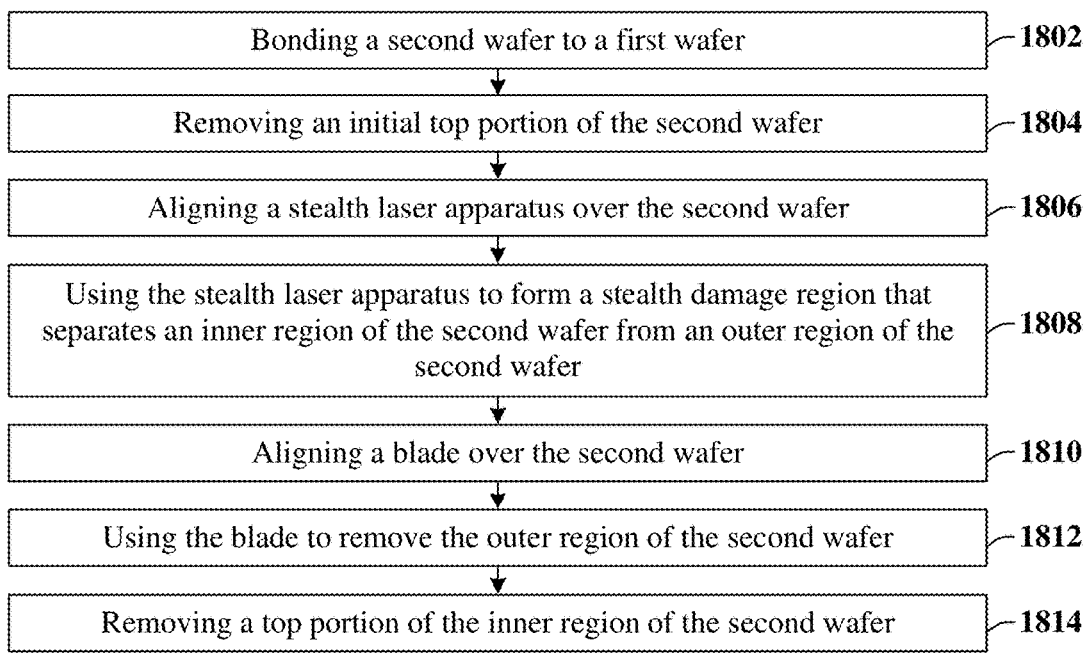
FIG. 18 illustrates a flow diagram of some additional embodiments of a method corresponding to FIGS. 16 and 17.

FIG. 18 illustrates a flow diagram of some embodiments of a method 1800 of performing a wafer edge trimming process using a stealth laser apparatus to mitigate damage to a second wafer that is trimmed and overlies a first wafer, wherein the wafer edge trimming process comprises an additional grinding process.

While method 1800 is illustrated and described below as a series of acts or events, it will be appreciated that the illustrated ordering of such acts or events are not to be interpreted in a limiting sense. For example, some acts may occur in different orders and/or concurrently with other acts or events apart from those illustrated and/or described herein. In addition, not all illustrated acts may be required to implement one or more aspects or embodiments of the description herein. Further, one or more of the acts depicted herein may be carried out in one or more separate acts and/or phases.

At act 1802, a second wafer is bonded to a first wafer. FIG. 3 illustrates cross-sectional view 300 of some embodiments corresponding to act 1802.

At act 1804, an initial top portion of the second wafer is removed. FIG. 16 illustrates a cross-sectional view 1600 of some embodiments corresponding to act 1804.

At act 1806, a stealth laser apparatus is aligned over the second wafer. FIG. 17 illustrates cross-sectional view 1700 of some embodiments corresponding to act 1806.

At act 1808, a stealth damage region that separates an inner region of the second wafer from an outer region of the second wafer is formed by using the stealth laser apparatus. FIG. 9 illustrates perspective view 900 of some embodiments corresponding to act 1808.

At act 1810, a blade is aligned over the second wafer. FIG. 10 illustrates cross-sectional view 1000 of some embodiments corresponding to act 1810.

At act 1812, the blade is used to remove the outer region of the second wafer. FIGS. 11B and 11C illustrate cross-sectional views 1100B and 1100C, respectively, of some embodiments corresponding to act 1812.

At act 1814, a top portion of the inner region of the second wafer is removed. FIGS. 13 and 14A illustrate cross-sectional views 1300 and 1400A, respectively, of some embodiments corresponding to act 1814.

Therefore, the present disclosure relates to a method of performing a wafer edge trimming process on a second wafer using a stealth laser apparatus to trim an outer region of the second wafer based on a stealth damage region formed by the stealth laser apparatus to reduce damage to the second wafer.

Accordingly, in some embodiments, the present disclosure relates to a method comprising: aligning a stealth laser apparatus over a wafer using an infrared camera coupled to the stealth laser apparatus; using the stealth laser apparatus to form a stealth damage region within the wafer that is continuously connected around the wafer and separates an inner region of the wafer from an outer region of the wafer, wherein the stealth damage region is arranged at a first distance horizontally from an edge of the wafer, wherein the stealth damage region is buried beneath a top surface of the wafer vertically, and wherein the stealth damage region extends from a first depth beneath a top surface of the wafer to a second depth beneath the top surface of the wafer; forming a groove in the wafer to separate the outer region from the inner region of the wafer, wherein the groove extends from the top surface to a bottom surface of the wafer; removing the outer region of the wafer using a blade; and removing a top portion of the inner region of the wafer using a grinding apparatus.

In other embodiments, the present disclosure relates to a method comprising: bonding a second wafer to a first wafer; aligning a stealth laser apparatus over the second wafer; using the stealth laser apparatus to form a stealth damage region that separates an inner region of the second wafer from an outer region of the second wafer, wherein the stealth damage region is arranged at a first distance from an outer perimeter of the second wafer, and wherein the stealth damage region extends from a first depth beneath a top surface of the second wafer to a second depth beneath the top surface of the second wafer; aligning a blade over the second wafer; removing the outer region of the second wafer using the blade; and removing a top portion of the inner region of the second wafer.

In yet other embodiments, the present disclosure relates to a method comprising: bonding a second wafer to a first wafer; removing an initial top portion of the second wafer; aligning a stealth laser apparatus over the second wafer; forming a stealth damage region between a top surface and a bottom surface of the second wafer that separates an inner region of the second wafer from an outer region of the second wafer using the stealth laser apparatus; aligning a blade over the second wafer; removing the outer region of the second wafer using the blade; and removing a top portion of the inner region of the second wafer.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method comprising:
aligning a stealth laser apparatus over a wafer using an infrared camera coupled to the stealth laser apparatus, wherein the infrared camera aligns the stealth laser apparatus using an alignment mark below the wafer;
using the stealth laser apparatus to form a stealth damage region within the wafer, the stealth damage region separating an inner region of the wafer from an outer region of the wafer;
forming a groove in the wafer to separate the outer region from the inner region of the wafer, wherein the groove extends from a top surface to a bottom surface of the wafer; and
applying a force to the wafer to remove the outer region of the wafer.

2. The method of claim 1, wherein the stealth damage region extends from a first depth beneath the top surface of the wafer to a second depth beneath the top surface of the wafer, the second depth being arranged at a distance above the bottom surface of the wafer, and wherein the distance above the bottom surface of the wafer is greater than 10 micrometers.

3. The method of claim 1, further comprising:
aligning a blade over the wafer using the infrared camera, the blade being configured to apply the force to the wafer.

4. The method of claim 1, wherein the method further comprises:
performing a grinding process to reduce a thickness of the wafer, wherein the grinding process is started after removing the outer region of the wafer.

5. The method of claim 1, wherein the alignment mark comprises a different material than the wafer.

6. The method of claim 1, further comprising:
bonding an additional wafer to the bottom surface of the wafer before aligning the stealth laser apparatus over the wafer.

7. The method of claim 1, wherein the outer region is a ring-like shape comprising an inner perimeter and an outer perimeter, wherein a minimum distance between the inner perimeter and the outer perimeter of the outer region is between 0.1 millimeters and 1 millimeter.

8. The method of claim 1, further comprising:
removing a top portion of the inner region of the wafer using a grinding apparatus, wherein the top portion of the inner region of the wafer comprises the stealth damage region.

9. A method comprising:
bonding a second wafer to a first wafer;
aligning a stealth laser apparatus over the second wafer using alignment marks on the first wafer;
using the stealth laser apparatus to form a stealth damage region that separates an inner region of the second wafer from an outer region of the second wafer, wherein the stealth damage region is arranged at a first distance from an outer perimeter of the second wafer, and wherein the stealth damage region extends from a first depth beneath a top surface of the second wafer to a second depth beneath the top surface of the second wafer;
aligning a blade over the second wafer;
removing the outer region of the second wafer using the blade; and
removing a top portion of the inner region of the second wafer.

10. The method of claim 9, wherein during the removing of the outer region of the second wafer, forces from the blade create a groove in the second wafer to completely separate the outer region from the inner region of the second wafer, wherein the groove extends from the top surface to a bottom surface of the second wafer, and wherein the groove intersects with the stealth damage region.

11. The method of claim 9, wherein the stealth damage region has a kerf width from a top-view perspective of the second wafer, wherein the kerf width is between 0.1 micrometers and 2 micrometers.

12. The method of claim 9, wherein the stealth damage region is continuously connected around the second wafer, and wherein a minimum value of the first distance is between 0.1 millimeters and 1 millimeter.

13. The method of claim 9, wherein the top portion of the inner region of the second wafer is removed by a grinding apparatus, and wherein the top portion of the inner region completely includes the stealth damage region.

14. The method of claim 9, further comprising:
removing an initial top portion of the second wafer using a grinding apparatus, wherein the removing of the initial top portion the second wafer is conducted after bonding the first and second wafers and before aligning the stealth laser apparatus.

15. The method of claim 9, wherein the removing of the top portion of the inner region of the second wafer is conducted after the removing of the outer region of the second wafer.

16. The method of claim 9, wherein the aligning of the stealth laser apparatus over the second wafer is conducted using an infrared camera that locates the alignment marks on the first wafer.

17. The method of claim 9, wherein the aligning of the blade over the second wafer is conducted using an infrared camera that locates the alignment marks on the first wafer.

18. A method comprising:
bonding a second wafer to a first wafer;
removing an initial top portion of the second wafer;
aligning a stealth laser apparatus over the second wafer;
forming a stealth damage region between a top surface and a bottom surface of the second wafer that separates an inner region of the second wafer from an outer region of the second wafer using the stealth laser apparatus;
aligning a blade over the second wafer using alignment marks on the first wafer;
removing the outer region of the second wafer using the blade; and
removing a top portion of the inner region of the second wafer.

19. The method of claim 18, wherein the stealth damage region of the second wafer is in the top portion of the inner region of the second wafer.

20. The method of claim 18, wherein during the removing of the outer region of the second wafer, forces from the blade create a groove in the second wafer to completely separate the outer region from the inner region of the second wafer, wherein the groove extends from the top surface to the bottom surface of the second wafer, and wherein the groove intersects with the stealth damage region.

* * * * *